United States Patent [19]

Takashima et al.

[11] Patent Number: 5,062,077

[45] Date of Patent: Oct. 29, 1991

[54] DYNAMIC TYPE SEMICONDUCTOR MEMORY DEVICE

[75] Inventors: Daisaburo Takashima, Kawasaki; Yukihito Oowaki, Yokohama; Kenji Tsuchida, Kawasaki, all of Japan

[73] Assignee: Kabushiki Kaisha Toshiba, Kawasaki, Japan

[21] Appl. No.: 556,470

[22] Filed: Jul. 24, 1990

[30] Foreign Application Priority Data

Jul. 31, 1989 [JP] Japan .................................. 1-196736
Nov. 30, 1989 [JP] Japan .................................. 1-311370

[51] Int. Cl.$^5$ .......................... G11C 5/08; G11C 7/02; H01L 27/10; H01L 23/48
[52] U.S. Cl. ...................................... 365/69; 365/210; 357/45; 357/68
[58] Field of Search ................... 357/45, 41, 68, 23.6; 365/69, 210

[56] References Cited

U.S. PATENT DOCUMENTS

| | | | |
|---|---|---|---|
| 4,044,340 | 8/1977 | Itoh | 357/41 |
| 4,675,845 | 6/1987 | Itoh et al. | 365/51 |
| 4,914,502 | 4/1990 | Lebowitz et al. | 357/45 |
| 4,941,031 | 7/1990 | Kumagai et al. | 357/45 |
| 5,014,110 | 5/1991 | Satoh | 357/45 |

FOREIGN PATENT DOCUMENTS

| | | |
|---|---|---|
| 3222461 | 12/1982 | Fed. Rep. of Germany . |
| 3438069 | 5/1985 | Fed. Rep. of Germany . |
| 76761 | 4/1987 | Japan .................................. 357/45 |
| 153792 | 6/1988 | Japan . |
| 183691 | 7/1988 | Japan .................................. 357/23.6 |

OTHER PUBLICATIONS

"A 60-ns 3.3-V-Only 16-Mbit DRAM with Multipurpose Register", IEEE Journal of Solid-State Circuits, vol. 24, No. 5, Oct. 1989, Kazutami Arimoto et al., pp. 1184-1190.

Hidaka et al., "Twisted Bit-Line Architectures for Multi-Megabit DRAM's", IEEE Journal of Solid-State Circuits, vol. 24, No. 1, Feb. 1989, pp. 21-27.

Kumanoya et al., "A Reliable 1-Mbit DRAM with a Multi-Bit-Test Mode", IEEE Journal of Solid-State Circuits, vol. SC-20, No. 5, Oct. 1985, pp. 909-913.

*Primary Examiner*—Rolf Hille
*Assistant Examiner*—Robert P. Limanek
*Attorney, Agent, or Firm*—Oblon, Spivak, McClelland, Maier & Neustadt

[57] ABSTRACT

A dynamic-type semiconductor memory device comprises bit lines, every two bit lines forming a folded bit line pair, every two pairs forming a bit-line unit such that one of the bit lines of the first pair extends between the bit lines of the second pair, and the bit lines of the second pair are twisted at middle portion, word lines intersecting with the bit lines, dummy word lines, extending parallel to the word lines, two of the dummy word lines being arranged on one side of the crossing portions of the bit lines of the second pair, and the other two of the dummy word lines being arranged on the other side of the crossing portions of the bit lines of the second pair, memory cells connected to selected ones of the intersections of the bit lines and the word lines, such that any adjacent memory cells connected to the same word line form a group which is arranged every two bit lines, and any adjacent two memory cells connected to the same bit line are shifted by half-pitch distance with respect to the corresponding two adjacent memory cells connected to either adjacent bit line, a plurality of dummy cells connected to selected ones of the intersections of the bit lines and the word lines, such that at least one dummy cell is connected to each bit line, and sense amplifiers provided for the pairs of bit lines, respectively.

21 Claims, 23 Drawing Sheets

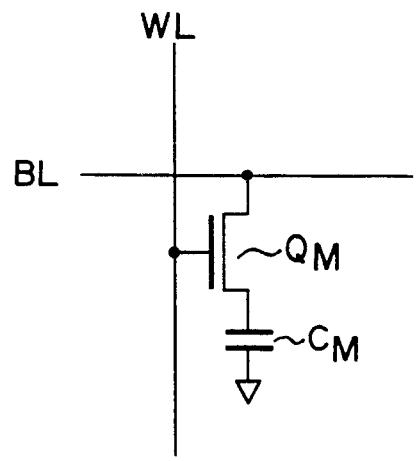
F I G. 2
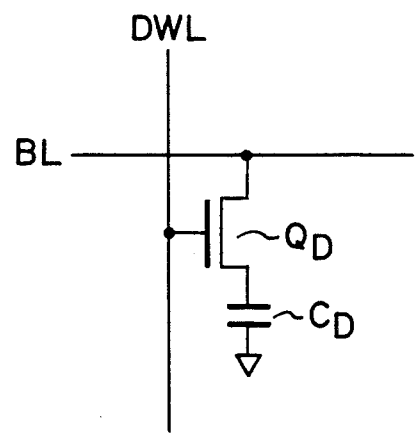
F I G. 3
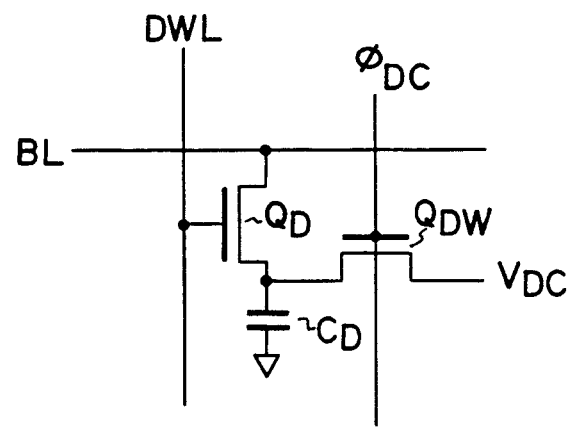
F I G. 4

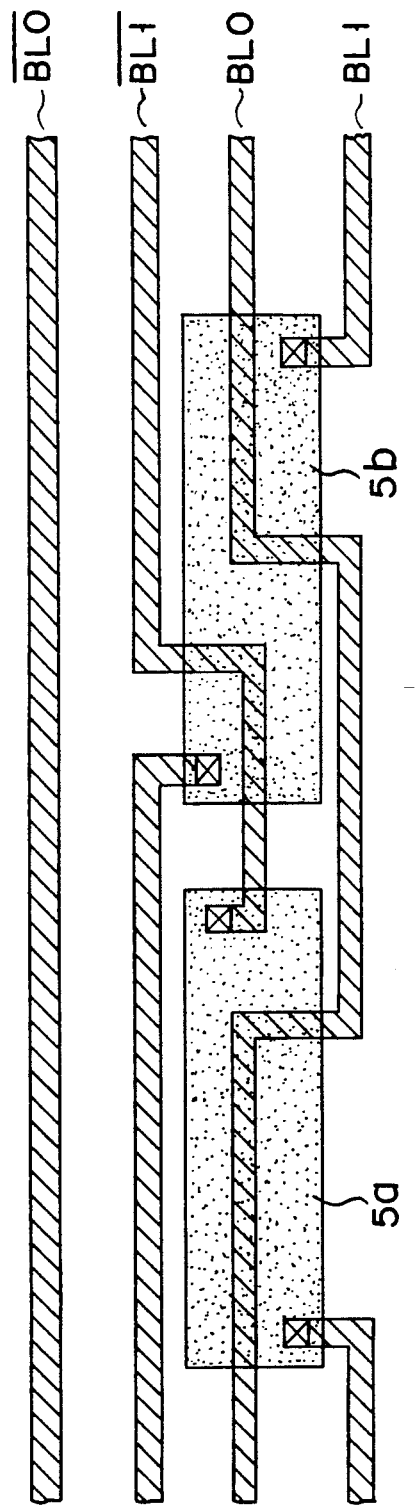
F I G. 7

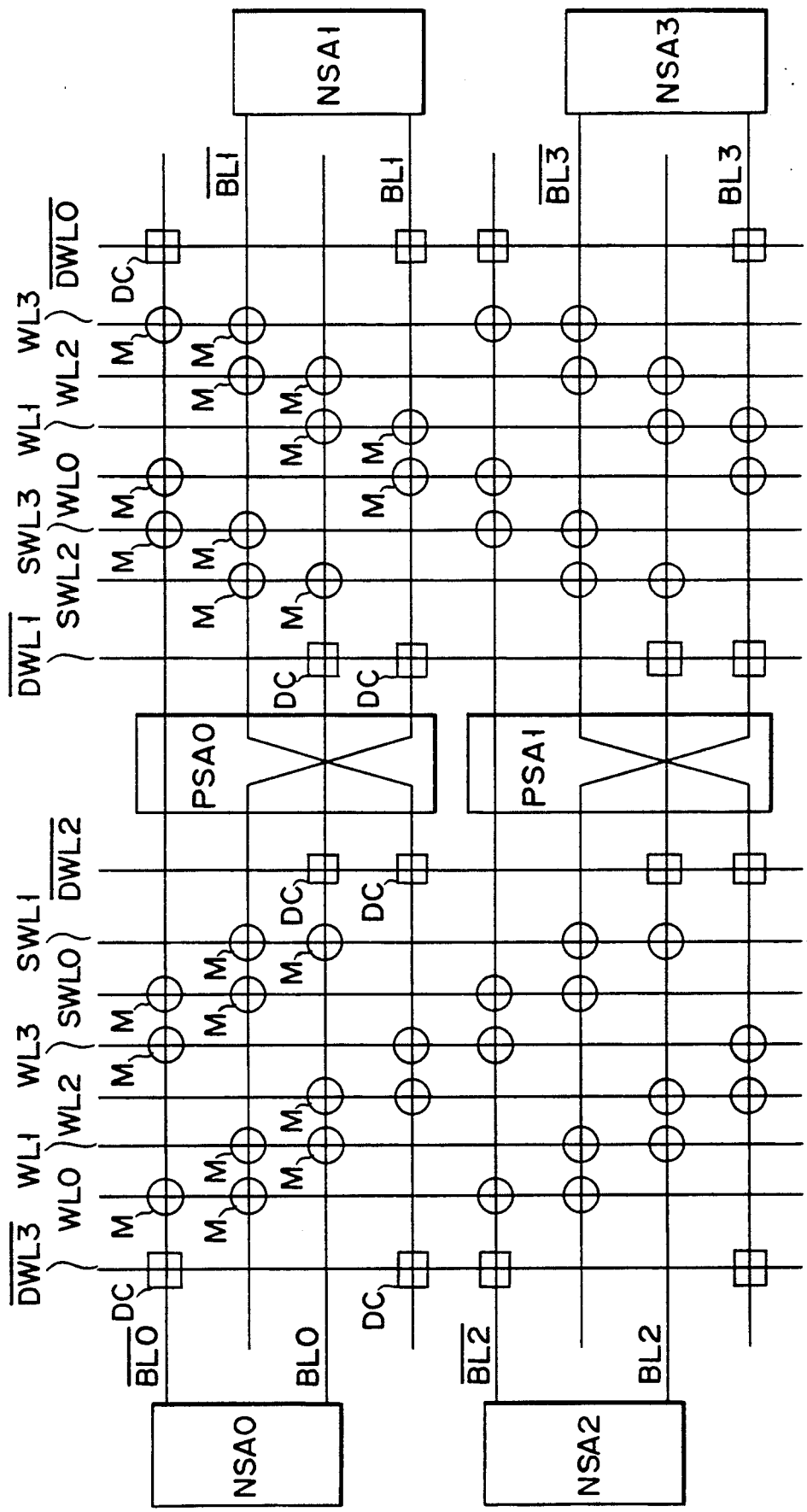
F I G. 12

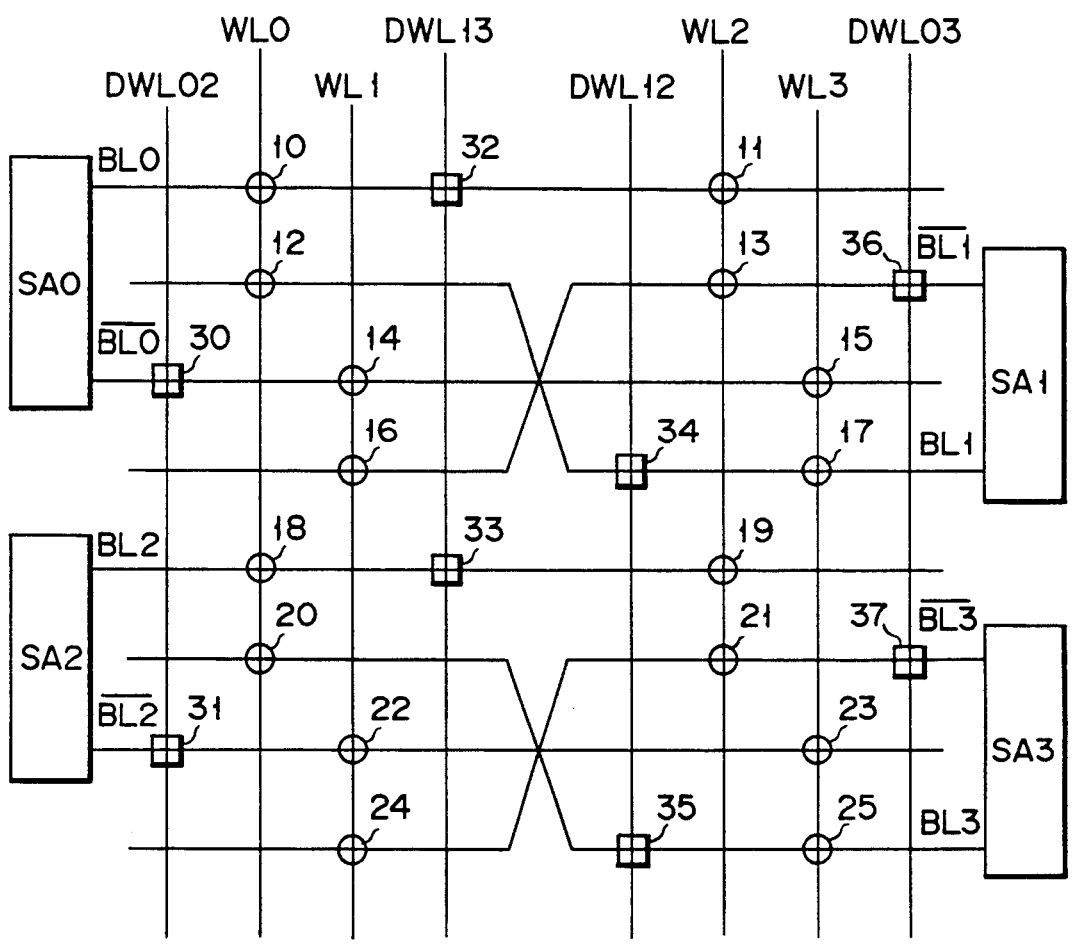
F I G. 18

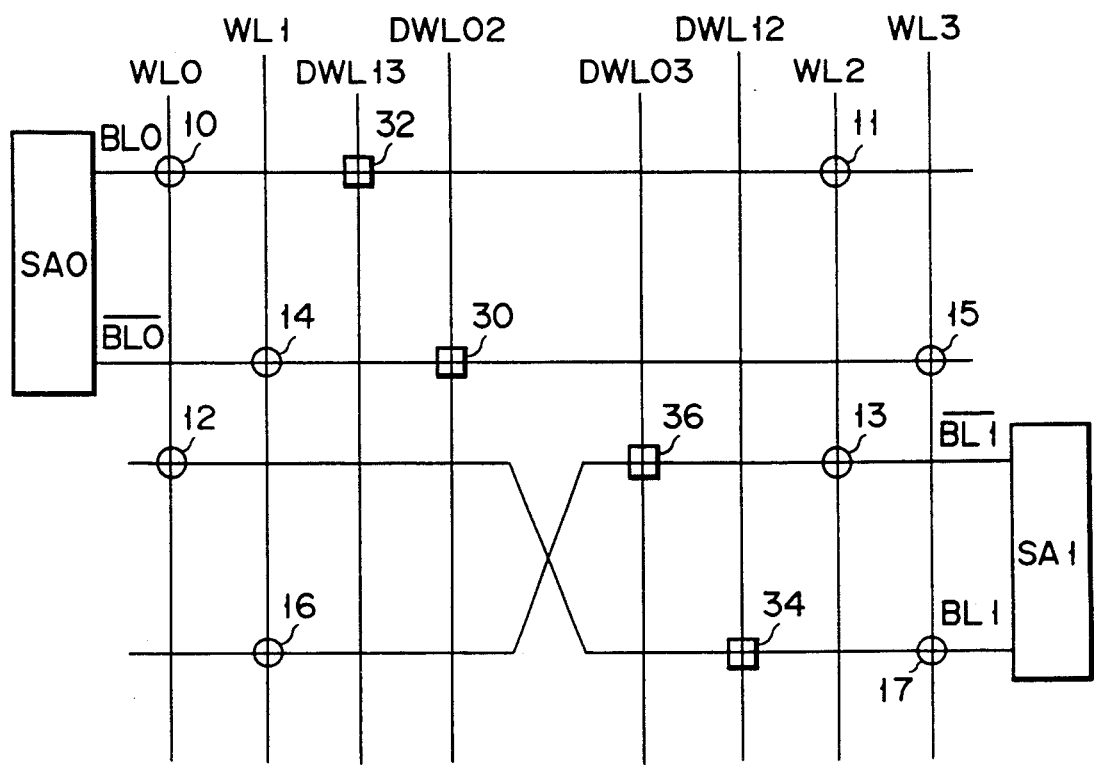
F I G. 21

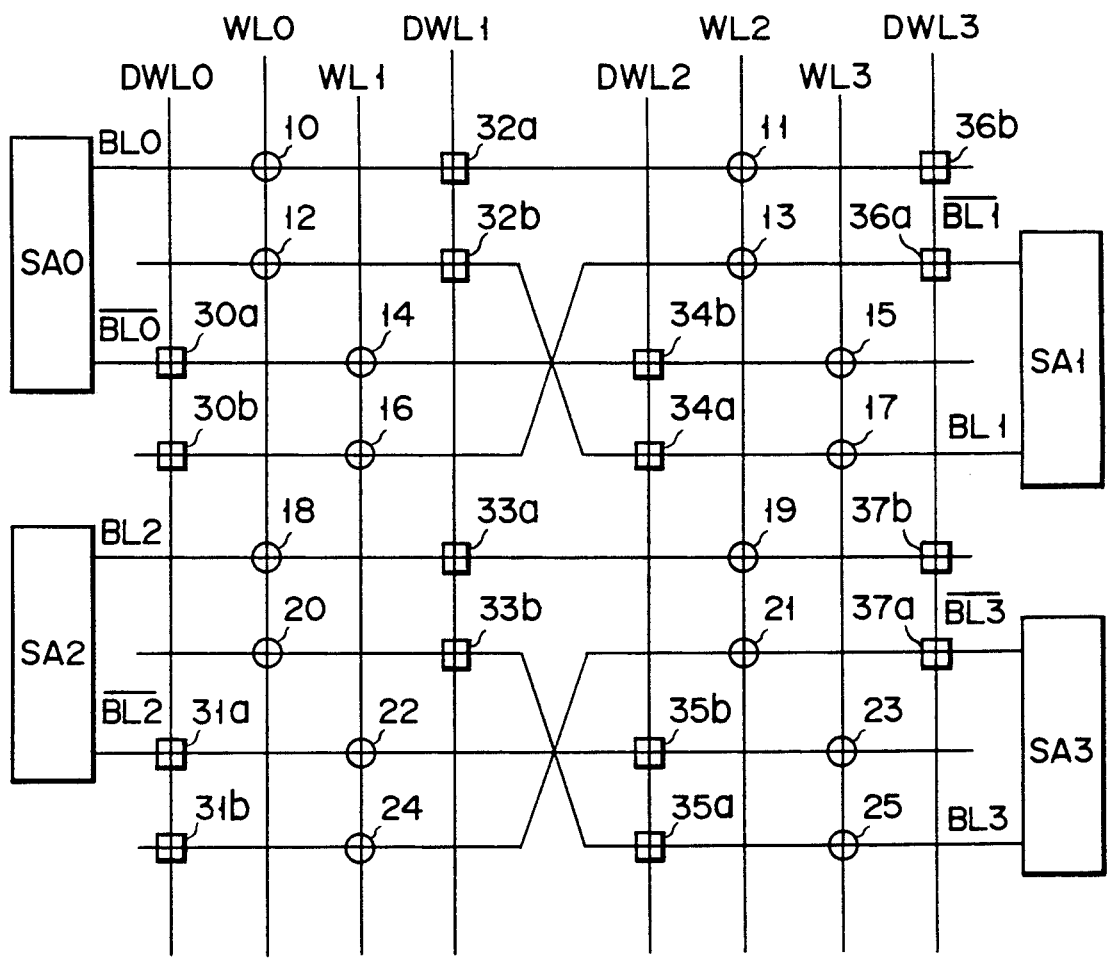
F I G. 23

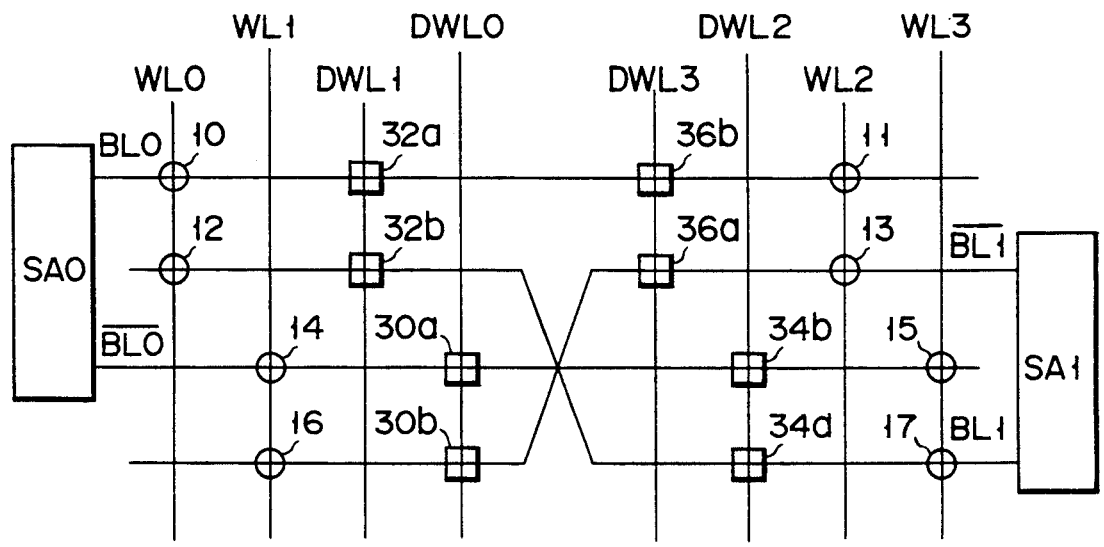
F I G. 24
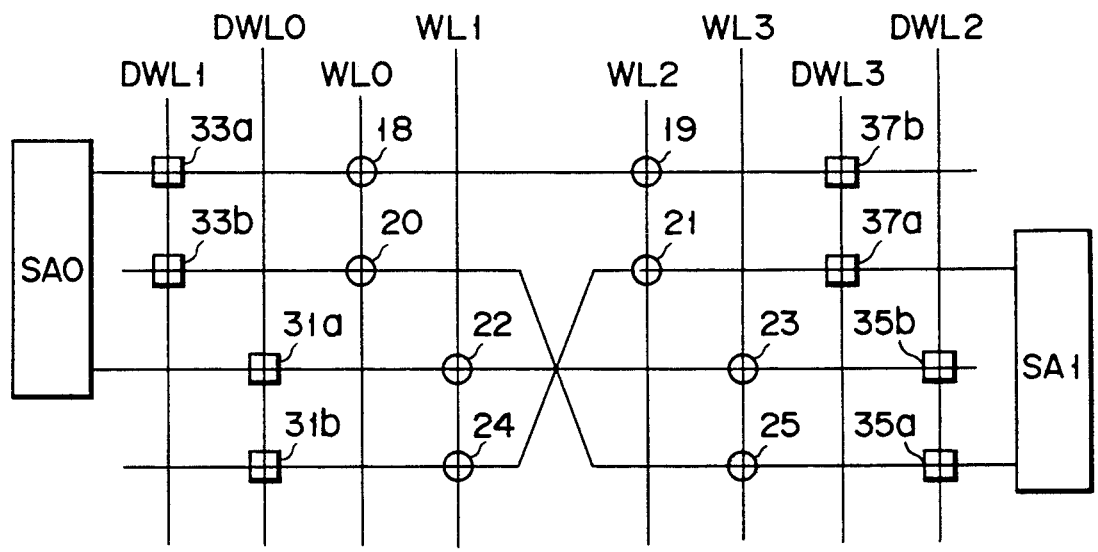
F I G. 25

DYNAMIC TYPE SEMICONDUCTOR MEMORY DEVICE

BACKGROUND OF THE INVENTION

1. Field of the Invention

The present invention relates to a dynamic type semiconductor memory device (DRAM), and more particularly to a dynamic type semiconductor memory in which the interference noise between bit lines can be small.

2. Description of the Related Art

Recent improvement of memory cell structure and recent progress in micro-processing technology have much enhanced the integration density of DRAMs which are semiconductor memories having memory cells each comprised of one transistor and one capacitor. The higher the integration density of a DRAM, the shorter the distance between any adjacent two bit lines through which the data stored in the memory-cell array is read to be amplified by an sense amplifier. The shorter this distance, the greater the coupling capacitance between the bit lines, and the larger the interference noise therebetween inevitably. As is known in the art, the interference noise between the bit lines is a prominent cause of inaccurate reading of data from the DRAM.

To solve this problem it has been proposed that any two adjacent bit lines be twisted, thereby to reduce the interference noise, as is disclosed in Published Unexamined Japanese Patent Application No. 63-148489 and also in ISSCC 88 Digest of Technical Papers, pp. 238–239. When the bit lines are twisted, the interference noise is reduced, but not sufficiently, and the memory-cell array becomes more complex inevitably.

In summary, the conventional DRAMs are disadvantageous in two respects. First, a considerably large interference noise is generated between any adjacent bit lines due to the coupling capacitance between them. Secondly, when the bit lines are twisted, the memory-cell array inevitably becomes complicated.

SUMMARY OF THE INVENTION

The object of the present invention is to provide a dynamic type semiconductor memory device in which the interference noise between bit lines is sufficiently small.

To accomplish this object, a first dynamic type semiconductor memory device according to this invention comprises:

a plurality of bit lines, every two bit lines forming a folded bit line pair, every two bit line pairs forming a bit line unit such that one of the bit lines of the first pair extends between the bit lines of the second pair, and the bit lines of the second pair are twisted at middle portion;

a plurality of word lines intersecting with the bit lines;

four dummy word lines extending parallel to the word lines, two of the dummy word lines being arranged on one side of the crossing portions of the bit lines of the second pair, and the other two of the dummy word lines being arranged on the other side of the crossing portions of the bit lines of the second pair;

a plurality of memory cells connected to selected ones of the intersections of the bit lines and the word lines, such that any adjacent two memory cells connected to the same word line form a group which is arranged every two bit lines, and any adjacent two memory cells connected to the same bit line are shifted by half-pitch distance with respect to the corresponding two adjacent memory cells connected to either adjacent bit line;

a plurality of dummy cells connected to selected ones of the intersections of the bit lines and the word lines, such that at least one dummy cell is connected to each bit line; and a plurality of sense amplifiers provided for the pairs of bit lines, respectively.

In this dynamic type semiconductor memory device, two pairs of bit lines form each bit-line unit, one of the bit lines of the first pair extends between the bit lines of the second pair, and the bit lines of the second pair are twisted at middle portion. Therefore, this achieves two advantages. First, the coupling capacitance between these bit lines is small enough not to generate a considerable interference noise without increasing the chip size. Second, it is easy to arrange the sense amplifier provided for each pair of bit lines, since the bit lines of each pair is spaced apart by a sufficiently long distance.

Further, since the every two memory cells are arranged in slanting rows, any adjacent two being spaced apart from the other two rows, it is easy to form cell plates having a predetermined width, in regions extending among the pairs of slanting memory-cell rows.

Moreover, since the dummy word lines and the dummy cells are arranged in the way specified above, data can be read correctly from the DRAM, despite of the bit lines of the second pair of each bit-line unit are twisted.

Still further, the dynamic-type semiconductor memory device can be modified into a sense-amplifier sharing type, in which dummy cells and dummy word lines can be used for driving adjacent sub-arrays of memory cells, and which can therefore has a high integration density.

Also, to achieve the object described above, a second dynamic-type semiconductor memory device according to the present invention comprises:

a plurality of bit lines, every two bit lines forming a folded bit line pair, every two bit line pairs forming a bit-line unit such that the bit lines of the first pair are twisted at middle portion;

a plurality of word lines intersecting with the bit lines;

four dummy word lines extending parallel to the word lines and intersecting with the bit lines, two of the dummy word lines being arranged on one side of the crossing portions of the bit lines of the second pair, and the other two of the dummy word lines being arranged on the other side of the crossing portions of the bit lines of the second pair;

a plurality of memory cells connected to selected ones of the intersections of the bit lines and the word lines, such that any adjacent two memory cells connected to the same word line form a group which is arranged every two bit lines, and are shifted by one-pitch distance with respect to the corresponding two adjacent memory cells connected to either adjacent word line;

a plurality of dummy cells connected to selected ones of the intersections of the bit lines and the word lines, such that at least one dummy cell is connected to each bit line; and means for selecting the dummy word lines of the same number as the pairs of bit lines forming the bit-line unit, when one of the word lines are selected.

In the second semiconductor memory device of the invention, one bit line of the first or second of each bit-line unit may extends between the bit lines of the other pair.

Further, according to this invention, two or more dynamic type semiconductor memory devices described above may be connected in cascade, and dummy word lines and dummy cells may be shared by any adjacent two of these devices.

According to the invention, there is provided a third dynamic-type semiconductor memory device which comprises:

a plurality of bit lines, every two bit lines forming a folded bit line pair, every two pairs forming a bit-line unit such that one of the bit lines of the first pair extends between the bit lines of the second pair, and the bit lines of at least one pair are twisted at middle portion;

a plurality of word lines intersecting with the bit lines;

four dummy word lines extending parallel to the word lines and intersecting with the bit lines, two of the dummy word lines being arranged on one side of the crossing portions of the twisted bit lines, and the other two of the dummy word lines being arranged on the other side of the crossing portions of the twisted bit lines;

a plurality of memory cells connected to selected ones of the intersections of the bit lines and the word lines, such that any adjacent two memory cells connected to the same word line form a group which is arranged every two bit lines, and are shifted by one-pitch distance with respect to the corresponding two adjacent memory cells connected to either adjacent word line;

a plurality of dummy cells connected to selected ones of the intersections of the bit lines and the word lines, such that at least two one dummy cells are connected to each bit line; and means for selecting the dummy word lines of half the number as the pairs of bit lines forming the bit-line unit, when one of the word lines are selected.

Since the bit lines of at least one pair, included in each bit-line unit, are twisted at middle portion, the interference noise between any adjacent two bit lines, which results from the capacitive coupling of the adjacent bit lines, is small.

Moreover, since the dummy word lines and the dummy cells are arranged in the specific manner as described above, the dynamic-type semiconductor memory device can efficiently operate despite the fact that the bit lines of some pairs are twisted.

Still further, the number of dummy cells required is small because the dummy cells are arranged in the specific scheme defined in first and second DRAM. Also, the number of dummy cells, which need to be selected simultaneously, can be reduced by arranging the dummy cells in a particular scheme described in third DRAM.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is an equivalent circuit diagram showing one of the identical memory cells incorporated in the DRAM shown in FIG. 1;

FIG. 3 is an equivalent circuit diagram illustrating one of the identical dummy cells incorporated in the first embodiment;

FIG. 4 is an equivalent circuit diagram showing another type of a dummy cell;

FIG. 7 is a plan view showing the twisted bit lines along with the straight bit line—all incorporated in the first embodiment;

FIG. 12 is a circuit diagram showing a DRAM according to a fourth embodiment of this invention;

FIG. 18 is a circuit diagram showing a DRAM according to a seventh embodiment of this invention;

FIG. 21 is a circuit diagram showing a modification of the eighth embodiment;

FIG. 23 is a circuit diagram illustrating a DRAM according to an eleventh embodiment of the invention;

FIG. 24 is a circuit diagram showing a DRAM according to a twelfth embodiment of the invention;

FIG. 25 is a circuit diagram showing a DRAM according to a thirteenth embodiment of the invention;

DETAILED DESCRIPTION OF THE PREFERRED EMBODIMENTS

A DRAM, which is a first embodiment of this invention will now be described, with reference to FIG. 1.

This DRAM has folded bit lines. Any two adjacent two pairs of bit lines form one bit-line unit. One of the bit lines of the first pair extends between the bit lines of the second pair, and the bit lines of the second pair are twisted at middle portion. More specifically, as can be understood from FIG. 1, a pair of bit lines BL0 and BL0 and an adjacent pair of bit lines BL1 and BL1 form a bit-line unit; and a pair of bit lines BL2 and BL2 and an adjacent pair of bit lines BL3 and BL3 form another bit-line unit. In the first bit-line unit, the bit line BL0 of the first pair extends between the bit lines BL1 and BL1 of the second pair, and the bit lines BL1 and BL1 are twisted at middle portion. Similarly, in the second bit-line unit, the bit line BL2 of the first pair extends between the bit lines BL3 and BL3 of the second pair, and the bit lines BL3 and BL3 are twisted at middle portion.

The DRAM comprises memory cells M, PMOS sense amplifiers PSA0, PSA1..., and NMOS sense amplifiers NSA0, NSA1, NSA2..., all designed to amplify data items read from the memory cells M. Each of the PMOS sense amplifiers PSA0, PSA1..., comprises p-channel MOS transistors, whereas each of the NMOS sense amplifiers NSA0, NSA1, NSA2, NSA3..., comprises n-channel MOS transistors. The PMOS sense amplifiers PSA0, PSA1..., are arranged in the twisted portion of the bit lines of the bit-line units, respectively. To be specific, the PMOS sense amplifier PSA0 is connected to the twisted portions of the bit BL1 and BL1, and the PMOS sense amplifier PSA1 is coupled to the twisted portions of the bit lines BL3 and BL3. Each of the NMOS sense amplifiers NSA0, NSA1, NSA2, NSA3..., is connected to the ends of the corresponding bit-line pairs. To be precise, the amplifier NSA0 is connected to the ends of the bit lines BL0 and BL0, the amplifier NSA1 to the ends of the bit lines BL1 and BL1, the amplifier NSA2 to the ends of the bit lines BL2 and BL2, and the amplifier NSA3 to the ends of the bit lines BL3 and BL3.

Figure 1:
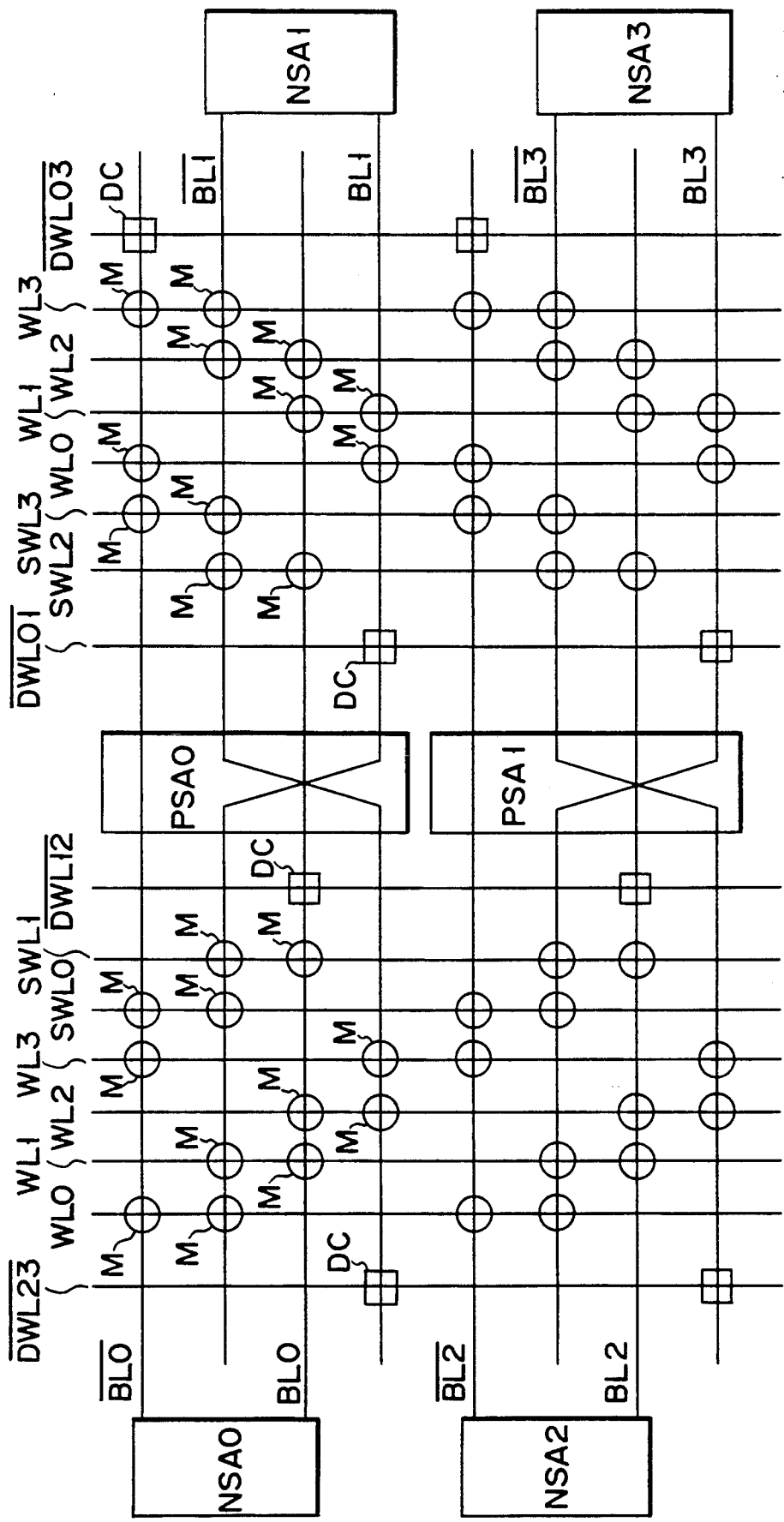
FIG. 1 is a circuit diagram showing a DRAM according to a first embodiment of the present invention.

The DRAM has two sets of word lines, each sets consisting of word lines WL0, WL1, WL2, WL3..., (only four shown in FIG. 1). The word lines of the first set intersect with those portions of the bit lines which extend on the left side of the PMOS sense amplifiers PSA0, PSA1.... The word lines of the second set intersect with those portions of the bit lines which extend on the right side of the PMOS sense amplifiers PSA0, PSA1.... The memory cells M are arranged at selected ones of the intersections of the bit lines and the word lines. As is shown in FIG. 2, each of the memory cells M consists of a switching MOS transistor $Q_M$ and a memory capacitor $C_M$.

The memory cells M are provided for each bit-line unit, and are arranged in a specific way as will be explained, taking for example the unit comprised of the pair of bit lines BL0 and BL0 and the pair of bit lines BL1 and BL1.

As is illustrated in FIG. 1, two memory cells M are located at adjacent two of the four intersections of each word line and the four bit lines BL0, BL0, BL1 and BL1. Further, adjacent two memory cells connected any bit line are shifted by half-pitch distance from the corresponding adjacent two memory cells connected to either adjacent bit line. More specifically, four memory cells M are located at the intersections of the word lines WL0 of both sets and the bit lines BL0 and BL1; four memory cells M are located at the intersections of the word lines WL1 of both sets and the bit lines BL1 and BL0; four memory cells M are located at the intersections of the word lines WL2 of both sets and the bit lines BL0 and BL1; and four memory cells M are located at the intersections of the word lines WL3 of both sets and the bit lines BL1 and BL0. In other words, as is shown in FIG. 1, these 16 memory cells M form four slanting 2-row units in the matrix of the bit lines BL0, BL0, BL1, and BL1 and the two sets of word lines WL0, WL1, WL2, and WL3, each slanting 2-row unit set apart from the adjacent unit by two-row distance.

As is illustrated in FIG. 1, a pair of spare word lines SWL0 and SWL1 intersect with those portions of the bit lines BL0, BL0, BL1, and BL1 which extend on the left side of the PMOS sense amplifiers PSA0 and PSA1. Similarly, a pair of spare word lines SWL2 and SWL3 intersect with those portions of the bit lines BL0, BL0 BL1, and BL1 which extend on the right side of the PMOS sense amplifiers PSA0 and PSA1.

Further, a pair of dummy word lines DWL01 and DWL03 intersect with those portions of the bit lines BL0, BL0, BL1 and BL1 which extend on the right side of the PMOS sense amplifiers PSA0 and PSA1, and a pair of dummy word lines DWL12 and DWL23 intersect with those portions of the bit lines BL0, BL0, BL1 and BL1 which extend on the right side of the PMOS sense amplifiers PSA0 and PSA1. More precisely, the dummy word lines DWL01 and DWL03 extends along the left and right sides of the right half of the memory-cell array, respectively, whereas the dummy word lines DWL12 and DWL23 extends along the right and left sides of the left half of the memory-cell array. Four dummy cells DC are located at four of the intersections of the the four dummy word lines and the bit lines of each bit-line unit. As for the bit-line unit consisting of the bit lines BL0, BL0, BL1, and BL1, for example, a first dummy cell is located at the intersection of the bit line BL1 and the dummy word line DWL23, a second dummy cell at the intersection of the bit line BL0 and the dummy word line DWL12, a third dummy cell at the inter section of the it line BL1 and the dummy word line DWL01, and the fourth dummy cell at the intersection of the bit line BL0 and the dummy word line DWL03. As is shown in FIG. 3, each of the dummy cells DC is comprised of one MOS transistor $Q_D$ and one memory capacitor $C_D$ like the memory cell M. Alternatively, it may be comprised of one MOS transistor $Q_D$, one memory capacitor $C_D$, and one writing transistor $Q_{DW}$ as is illustrated in FIG. 4.

In the embodiment shown in FIG. 1, the four dummy word lines DWL12, DWL23, DWL01, and DWL03 have a potential at a "H" level when they are precharged. When any one of the word lines is energized, thus selecting two of the memory cells M, the two dummy word lines, which drive the two dummy cells connected to the bit lines coupled to the two selected memory cells M, have its potential set at an "L" level. In other words, these dummy word lines are driven in "reverse phase." More precisely, when the word line WL0 is energized, thus having its potential set at the "H" level, the dummy word lines DWL01 and WDL03 have their potentials set at the "L" level; when the word line WL1 is energized, thus having its potential set at the "H" level, the dummy word lines DWL01 and WDL12 have their potentials set at the "L" level; when the word line WL2 is energized, thus having its potential set at the "H" level, the dummy word lines DWL12 and WDL23 have their potentials set at the "L" level; and when the word line WL3 is energized, thus having its potential set at the "H" level, the dummy word lines DWL23 and WDL03 have their potentials set at the "L" level.

Figure 5:
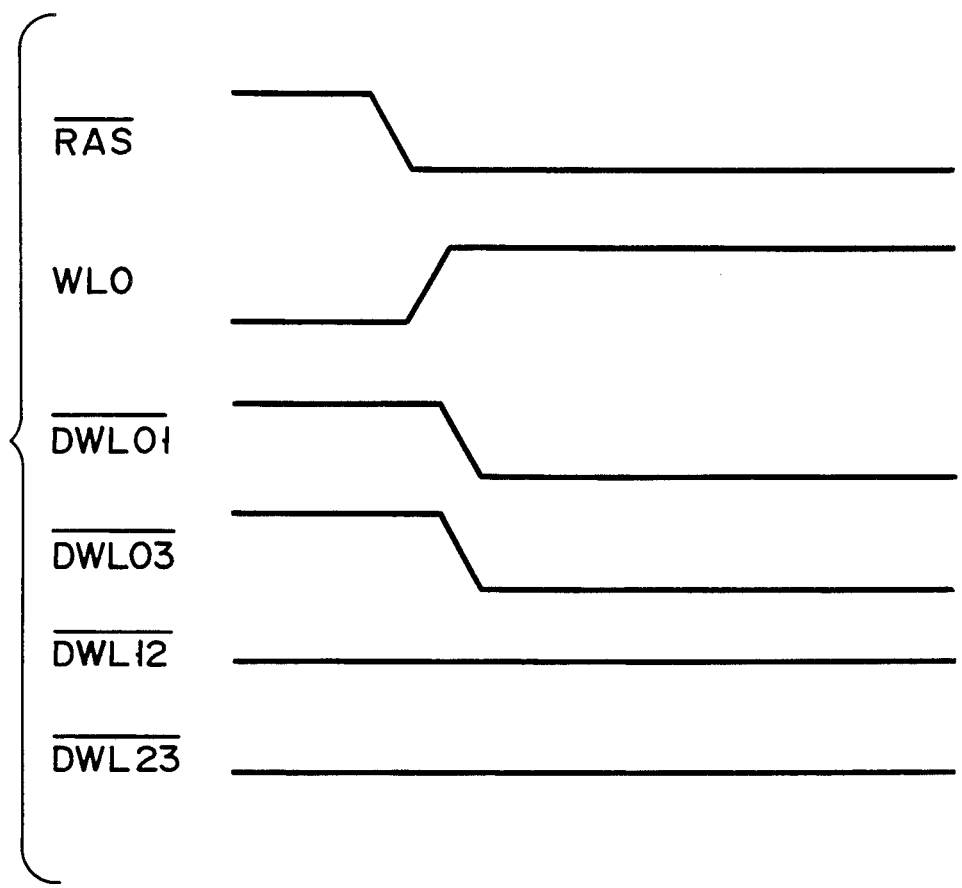
FIG. 5 is a timing chart explaining how each dummy cell used in the first embodiment operates.

The driving of the word lines and the dummy word lines, briefly described in the preceding paragraph, will now be explained in more detail, with reference to the timing chart of FIG. 5.

When a $\overline{RAS}$ falls to the "L" level, the potential of the word line WL0 rises to the "H" level. As a result, the potentials of the dummy word lines DWL01 and DWL03 fall from the "H" level to the "L" level. At this time, the potentials of the other dummy word lines DWL12 and DWL23 remain at the "H" level. As is shown in FIG. 1, only one dummy cell DC is connected to the bit line BL0. The dummy word line DWL03, which is connected to this dummy cell DC, is driven in reverse phase, thus having its potential set to the "L" level, when the word line WL0 is energized. Therefore, the selected memory cell has a data-outputting ability of $C_B/C_S$, where $C_B$ and $C_S$ are the capacitances of the bit line BL0 and the selected memory cell MC, respectively. This is because the capacitance $C_D$ of the dummy cell DC can be omitted. Hence, the data-outputting ability of the selected memory cell MC is increased when the dummy word line DWL03 is driven in reverse phase.

On the other hand, when the potential of the dummy line DWL03 is at the "H" level, the capacitance $C_D$ of the dummy cell DC is no longer negligible, and the data-outputting ability of the memory cell MC is $(C_B+C_D)/C_S$. Obviously, in the present embodiment, the selected memory cell MC has a great data-outputting ability since the dummy word line connected to the selected memory cell has its potential set at the "L" level.

Furthermore, since only one dummy cell is provided for each dummy word line in respective bit-line unit, gate capacitance is low, thereby achieving high speed operation. Since the number of the dummy cells is low, a low drive power of a drive circuit can be used to drive the dummy word line. Therefore, the area of the drive circuit can be reduced to achieve a high integration.

Figure 6:
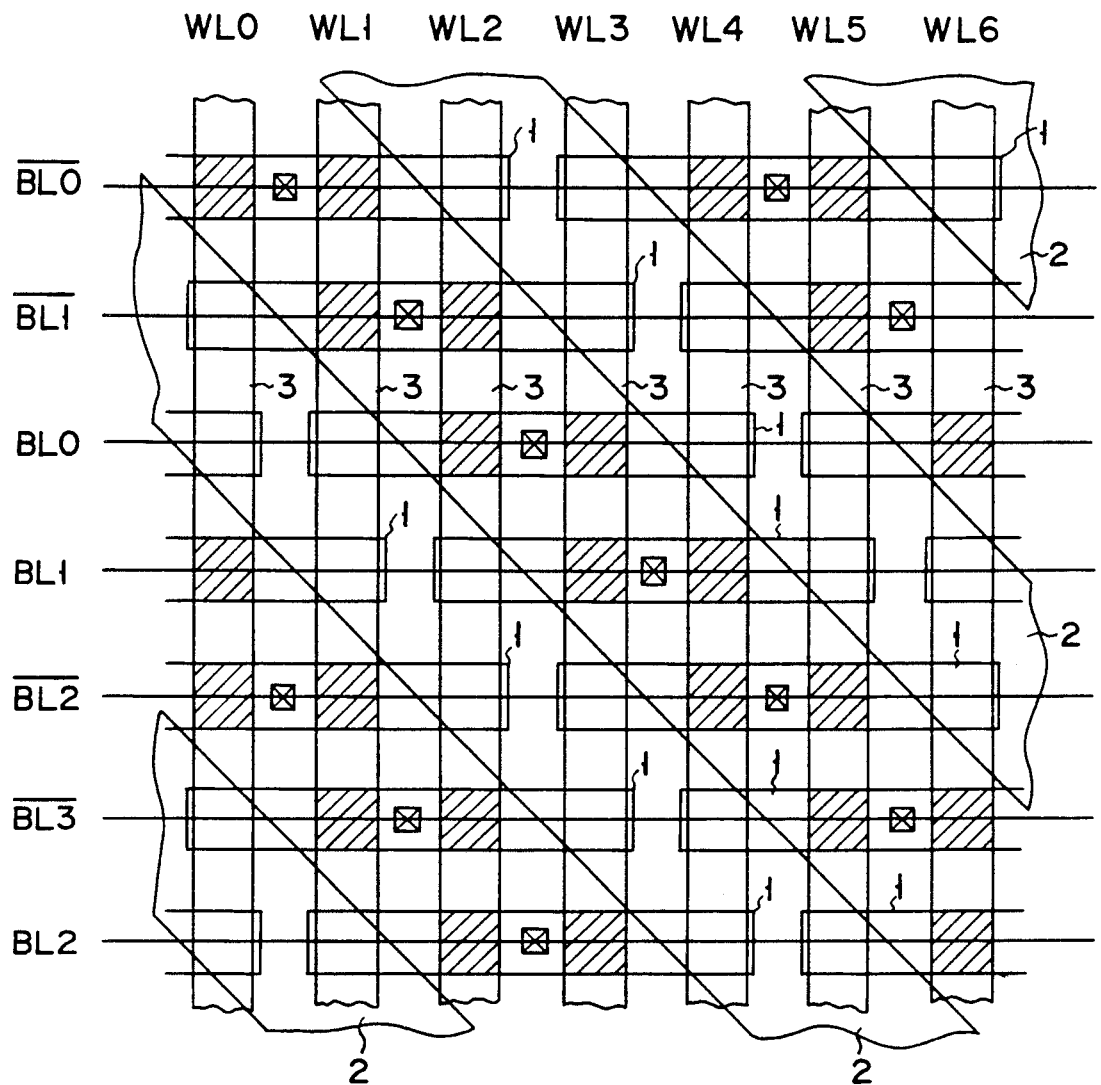
FIG. 6 is a plan view schematically representing the memory-cell array of the first embodiment.

FIG. 6 is a plan view schematically representing the layout of the memory-cell array incorporated in the DRAM shown in FIG. 1. As is illustrated in FIG. 6, element-forming regions 1 are formed in the surface of a silicon substrate, and are electrically isolated from one another by element-isolating insulating films also formed in the surface of the substrate. Cell plates 2 are formed on the substrate which are slanting strips made of polysilicon and which are each a common electrode connecting the capacitors of memory cells. Gate electrodes 3 of the switching MOS transistors of the memory cells are also formed on the silicon substrate, which are made of polysilicon and function as word lines WL. The MOS transistors are formed in those portions of the element-forming regions 1 between the cell plates 2. The MOS transistors have gate regions which are shaded in FIG. 4. The bit lines BL0, BL0, BL1, BL1, BL2, BL2, BL3, BL3 . . . , are aluminum strips contacting the common drain region of adjacent MOS transistors; they have a predetermined width, though shown as straight lines in FIG. 6.

As has been explained with reference to FIG. 1, the bit lines BL1 and BL1 are twisted in the PMOS sense amplifier PSA0, and the bit lines BL3 and BL3 are twisted in the PMOS sense amplifier PSA1. The twisting can be achieved without using special wiring, by utilizing the gate electrodes of the MOS transistors forming the sense amplifiers PSA0 and PSA1. For example, the bit line BL1 and BL1 are twisted as is illustrated in FIG. 7. As this figure shows, the gate electrodes 5a and 5b of two MOS transistors forming the sense amplifier PSA0 are connected to the bit lines BL1 and BL1, respectively. These gate electrodes 5a and 5b are first-layer polysilicon strips, whereas the bit lines BL1 and BL1 are second-layer polysilicon strips. The bit line BL1 is connected to the gate electrode 5a so that the electrode 5a is used as part of the bit line BL1. Similarly, the bit line BL1 is connected to the gate electrode 5b so that the electrode 5b is used as part of the bit line BL1. The bit line BL0 crosses over the gate electrodes 5a, and the bit lines BL0 and BL1 over the gate electrode 5b, not connected to either gate electrode.

Figure 8:
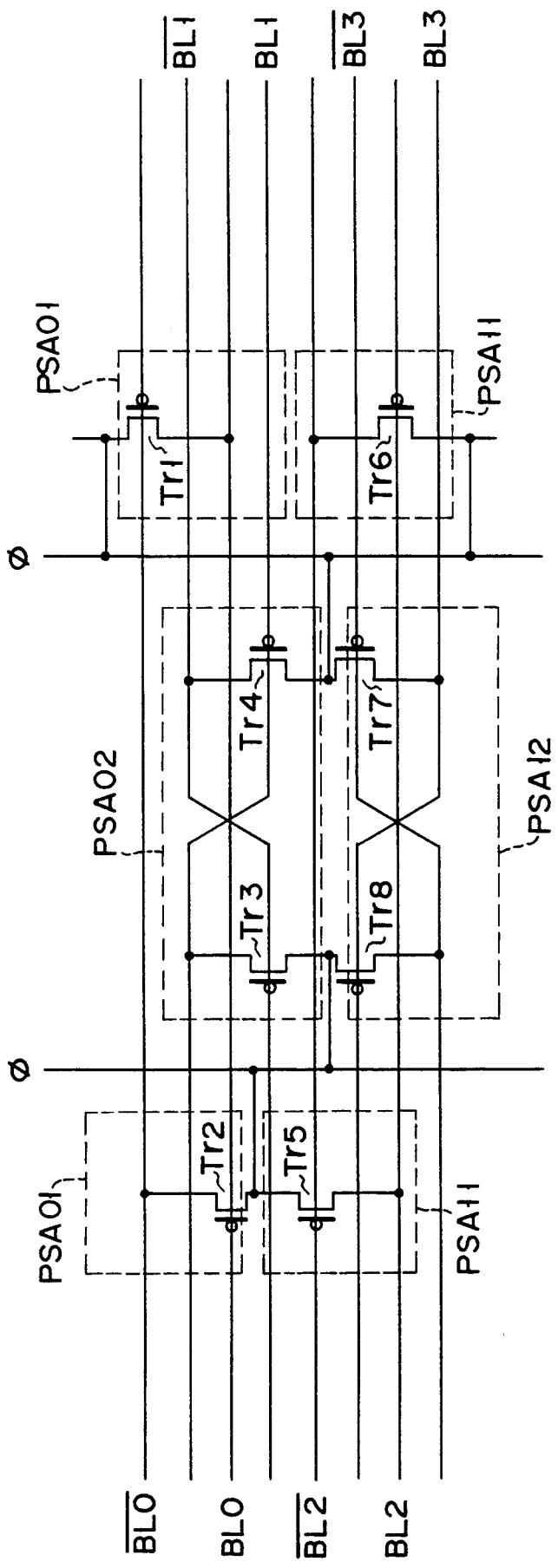
FIG. 8 is an equivalent circuit diagram of the PMOS sense amplifier section of the first embodiment.
Figure 9:
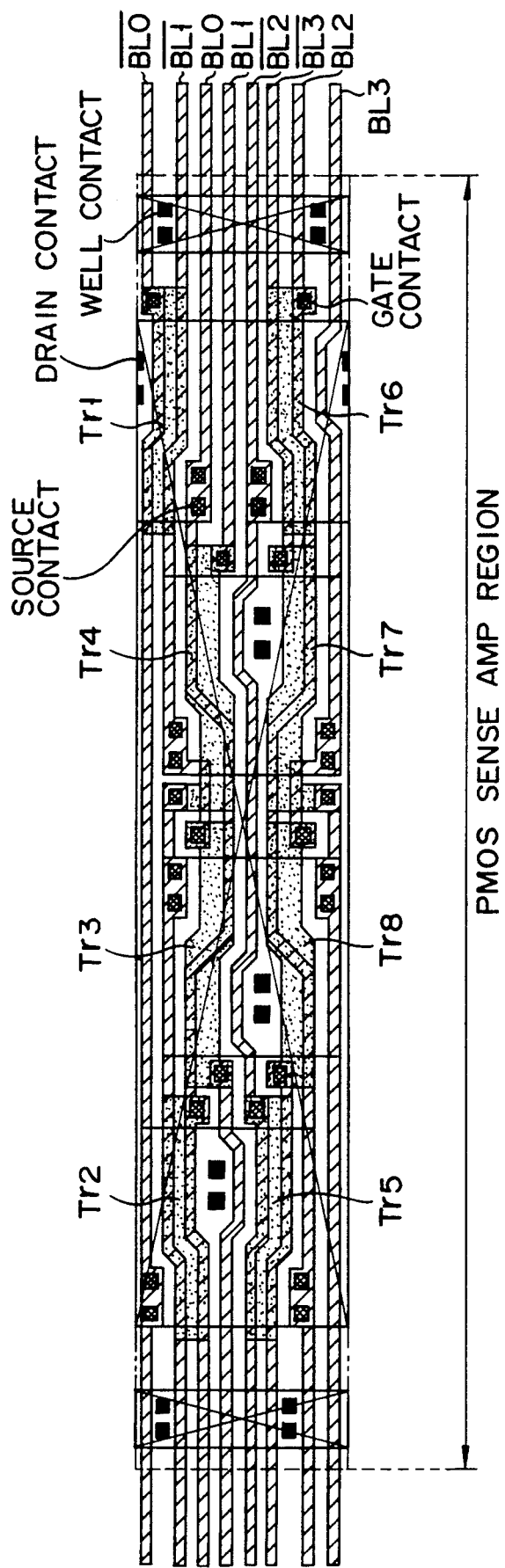
FIG. 9 is a layout diagram of the PMOS sense amplifier section of the first embodiment.

FIG. 8 is an equivalent circuit diagram showing, in detail, the PMOS sense amplifier section of the DRAM illustrated in FIG. 1, and FIG. 9 is a layout diagram of this PMOS sense amplifier section.

As is shown in FIG. 8, the PMOS sense amplifier PSA0 provided for the two pairs of bit lines, BL0, BL0, BL1 and BL1, which form a bit-line unit, comprises two dynamic sense amplifiers PSA01 and PSA01. The dynamic sense amplifier PSA01 is connected to the bit lines BL0 and BL0 and comprised of p-channel MOS transistors Tr1 and Tr2. The dynamic sense amplifier PSA02 is connected to the bit lines BL1 and BL1 and comprised of p-channel MOS transistors Tr3 and Tr4. The p-channel MOS transistors Tr1 to Tr4 which form the dynamic sense amplifiers PSA01 and PSA02 have their elongated gate electrodes extending along the bit lines BL0, BL0, BL1 and BL1.

The PMOS sense amplifier PSA1 provided for the two pairs of bit lines, BL2, BL2, BL3 and BL3, which form another bit-line unit, also comprises two dynamic sense amplifiers PSA11 and PSA12. The dynamic sense amplifier PSA11 is connected to the bit lines BL2 and BL2 and comprised of p-channel MOS transistors Tr5 and Tr6. The dynamic sense amplifier PSA12 is connected to the bit lines BL3 and BL3 and comprised of p-channel MOS transistors Tr7 and Tr8. The p-channel MOS transistors Tr5 to Tr8 which form the dynamic sense amplifiers PSA11 and PSA12 have their elongated gate electrodes extending along the bit lines BL2, BL2, BL3 and BL3.

As viewed in the direction of the word lines, each of the MOS transistors constituting the PMOS sense amplifiers PSA0 and PSA1 is provided for four bit lines. The bit lines BL1 and BL1 are twisted since they are connected to the gate electrodes of the MOS transistors Tr3 and Tr4 forming the dynamic sense amplifier PSA02, in the specific way shown in FIG. 7. The bit lines BL3 and BL3 are also twisted since they are connected to the gate electrodes of the MOS transistors Tr7 and Tr8 constituting the dynamic sense amplifier PSA12, in a specific manner similar to that shown in FIG. 7.

The NMOS sense amplifiers NSA0 to NSA3, all shown in FIG. 1, are identical in structure to the PMOS sense amplifiers PSA0 and PSA1, except that each is comprised of dynamic sense amplifier made of n-channel MOS transistors.

As is evident from FIGS. 1 and 8, of the bit lines of two pairs forming each bit-line unit, those of one pair have their middle portion twisted. Therefore, the interference noise between these bit lines is less than in the case where they are not twisted, and will not reduce the sense margin of the PMOS sense amplifier.

In the case of the bit lines BL1 and BL1, they are spaced apart from each other, though adjacent to the bit lines BL0, BL0 and BL2. The bit line BL2 interferes with the bit lines BL1 and BL1 to substantially the same degree since the bit lines BL1 and BL1 cross over each other at the middle portion. As a result, the interference of the bit line BL2 does not vary the potential difference between the bit lines BL1 and BL1. Nor does the interference, which the bit lines BL0 and BL0 impose on the bit lines BL1 and BL1, vary the potential difference between the bit lines BL1 and BL1. Hence, the sense margin of the PMOS sense amplifier PSA0 is not reduced at all.

In the case of the bit lines BL2 and BL2, they are adjacent to the bit lines BL1, BL1, BL3 and BL3. Let us assume that the word line WL0 is selected to read an "H" level from a memory cell M connected to the bit line BL2 and a "L" level from a memory cell M connected the bit line BL3. In this case, which is the worst possible case, the bit line BL2 receives an interference noise from the bit line BL1, but this noise is half the ordinary value since only half of the bit line BL2 extends close to the bit line BL1. The bit line BL2 receives no interference noise from the bit line BL3 since the left half of the bit line BL3 has the same coupling capacitance with respect to the bit lines BL2 and BL2, and the interference noise emanating from the left half of the bit line BL3 cancel out each other. The bit line BL2 receives the interference noise from the right half of the bit line BL3, which has been generated by half the coupling capacitance of the bit line BL3. There is no interference noise between the bit lines BL2 and BL2 since these bit lines are not adjacent. The bit lines BL1 and BL3 remains at the precharge potential, e.g., ½ Vcc, because a memory cell is connected to neither the intersection of the word line WL0 and the bit line BL1 nor the intersection of the word line WL0 and the bit line BL3. Therefore, the interference noise between the bit lines BL2 and BL2 is only half the value in the conventional DRAM, even in the worst possible case.

In the embodiment shown in FIGS. 1 and 8, two dummy word lines must be energized to select one word line. This means that the load of either dummy word line is lower than the load in the system in which two dummy word lines are prepared and only one dummy word line is energized. Further, since only one dummy memory cell is connected to each of the bit lines, the capacitance of each bit line is much less than in the conventional DRAM in which one of the four dummy word lines is set at the "L"-level potential, but the other three dummy word lines are set at the "H"-level potential, thereby increasing the capacitance of the bit line by the capacitance of the dummy cells. Hence, data can be read from the DRAM shown in FIGS. 1 and 8 more readily than from the conventional DRAM.

As is illustrated in FIG. 6, the cell plates 2 are straight strips, each having no neck, and are set apart by a relatively long distance. Hence, they are easy to form and can apply a stable reference potential to the memory cells M.

Figure 10:
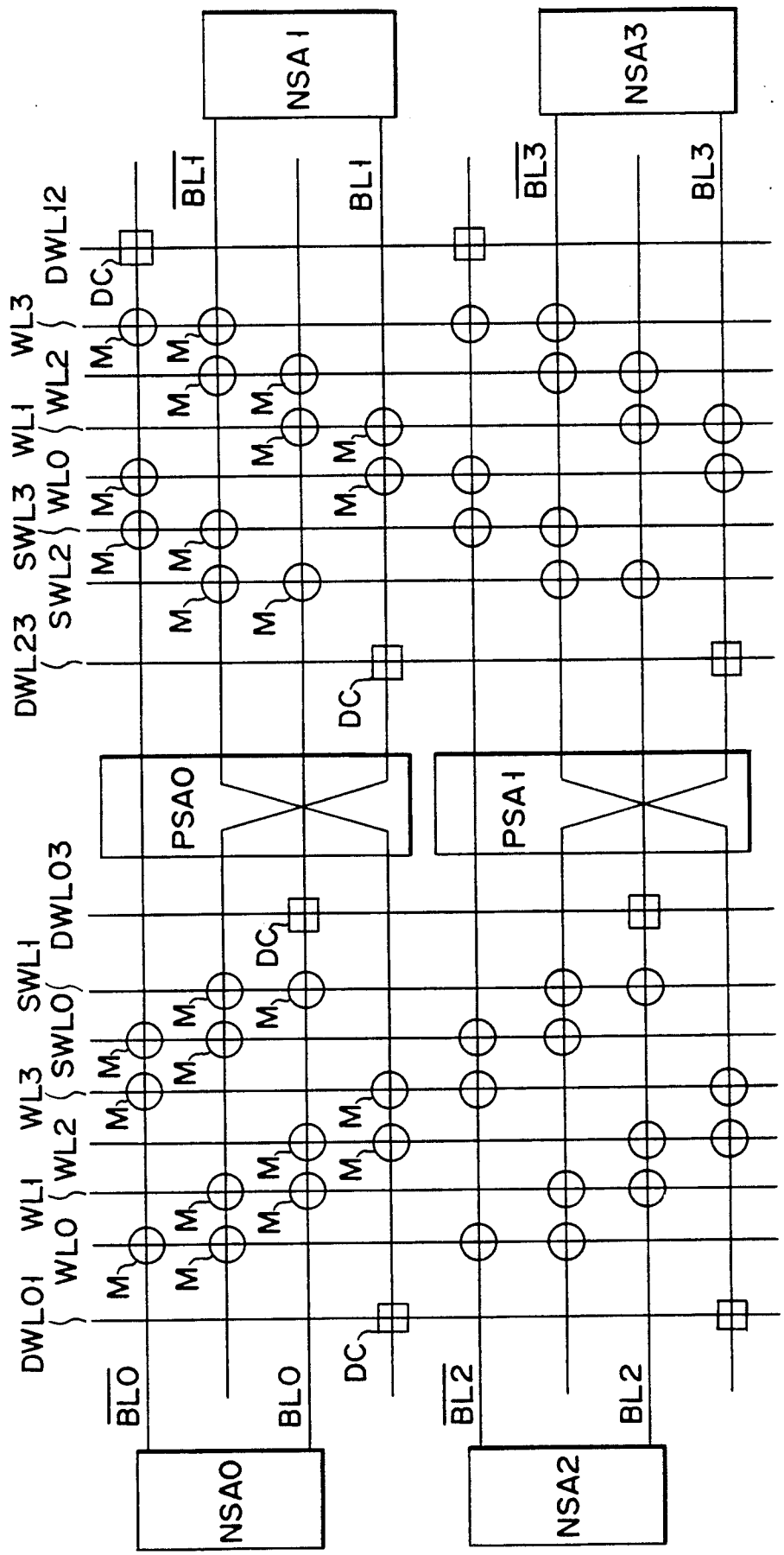
FIG. 10 is a circuit diagram illustrating a DRAM according to a second embodiment of the invention.

FIG. 10 is a circuit diagram illustrating the main section of a DRAM according to a second embodiment of the invention. The same reference numerals are used in FIG. 10, denoting elements identical to those shown in FIG. 1, and these identical elements will not be described in detail.

As can be understood from FIG. 10, the second embodiment is different from the first embodiment, in that the dummy word lines DWL are driven in forward phase. More specifically, the four dummy word lines DWL01, DWL03, DWL12 and DWL23 of either set are set at the "L"-level potential when they are precharged. When one of the word lines is selected and set at the "H"-level potential, two of the dummy word lines are selected and set at the "H"-level potential. To be more specific, when the word line WL0 is selected, the dummy word lines DWL01 and DWL03 are selected; when the word line WL1 is selected, the dummy word lines DWL01 and DWL12 are selected; when the word line WL2 is selected, the dummy word lines DWL12 and DWL23 are selected; and when the word line WL3 is selected, the dummy word lines DWL23 and DWL03 are selected. The second embodiment, therefore, achieve the same advantages as the first embodiment.

Figure 11:
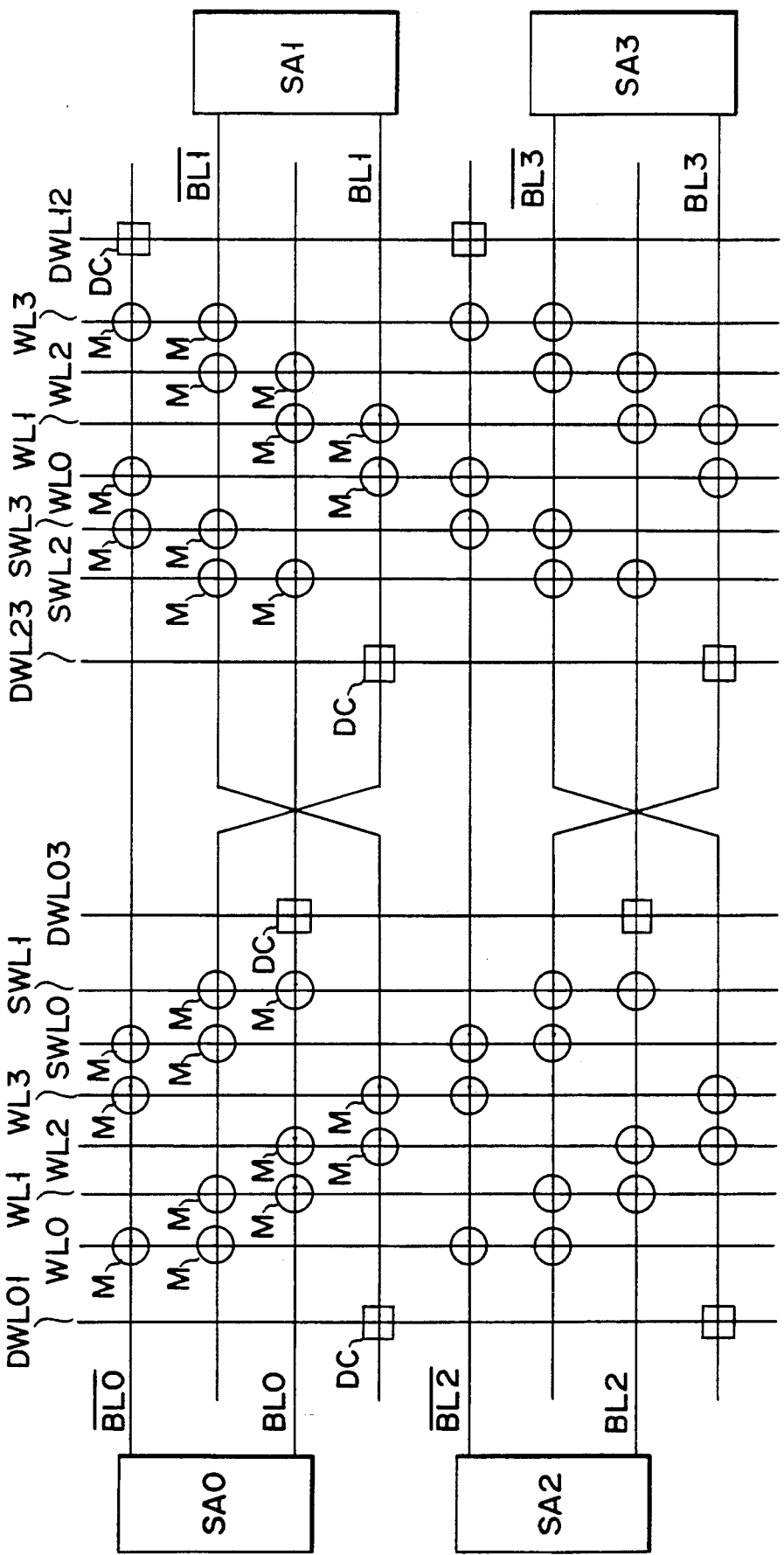
FIG. 11 is a circuit diagram showing a DRAM according to a third embodiment of the invention.

FIG. 11 is a circuit diagram showing a DRAM according to a third embodiment of the invention, which is a modification of the second embodiment shown in FIG. 10. In the third embodiment, four sense amplifiers SA0, SA1, SA2, and SA3, each constituted by an NMOS sense amplifier and a PMOS sense amplifier, are used, instead of two PMOS sense amplifiers and four NMOS sense amplifiers. Although the gate electrodes of the MOS transistors of the sense amplifiers SA0 to SA3 cannot be used to twist the bit lines BL1 and BL1 or the bit lines BL3 and BL3, the bit lines of either pair can be twisted in a way similar to that method explained with reference to FIG. 7. The third embodiment accomplishes the same advantages as the first and second embodiments.

In this regard, it should be noted that the first embodiment can be modified, thus forming a DRAM similar to the third embodiment shown in FIG. 11.

FIG. 12 illustrates a DRAM according to a fourth embodiment of this invention. The fourth embodiment differs from the first embodiment (FIGS. 1 and 8) in that two dummy cells are connected to each bit line. More precisely, two dummy cells DC are located at the intersections of the bit line BL0 and the dummy word lines DWL0 and DWL3, respectively, and two dummy cells DC are located at the intersections of the bit line BL0 and the dummy word lines DWL1 and DWL2, respectively. In other words, two dummy cells DC are connected to each of the four dummy word lines DWL0 to DWL03, each intersecting with the bit lines of two adjacent pairs which constitute a bit-line unit.

In the fourth embodiment shown in FIG. 12, the dummy word lines DWL0 to DWL3 are driven in reverse phase, and are thus set at the "H"-level potential when precharged. When one of the word lines WL is selected, and its potential increases to the "H" level, one of the four dummy word lines is selected, whereby its potential decreases to the "L" level. More specifically, when the word line WL0 is selected, having its potential to the "H" level, the dummy word line DWL0 is selected and set to the "L"-level potential. Similarly, when the word line WL1 is selected, the dummy word line DWL1 is selected; when the word line WL2 is selected, the dummy word line DWL2 is selected; and when the word line WL3 is selected, the dummy word line DWL3 is selected.

Thus, in the fourth embodiment, one dummy cell DC is connected to each bit line coupled to any selected memory cell M, and two dummy cells are coupled to the bit line which forms a pair along with the bit line coupled to the selected memory cell M. Certainly the fourth embodiment need to have twice as many dummy cells as is required in the first embodiment (FIG. 1), but it suffices to select only one dummy word line to drive a dummy cell. Obviously, it is easier to select the dummy cells than in the DRAM shown in FIG. 1.

Figure 13:
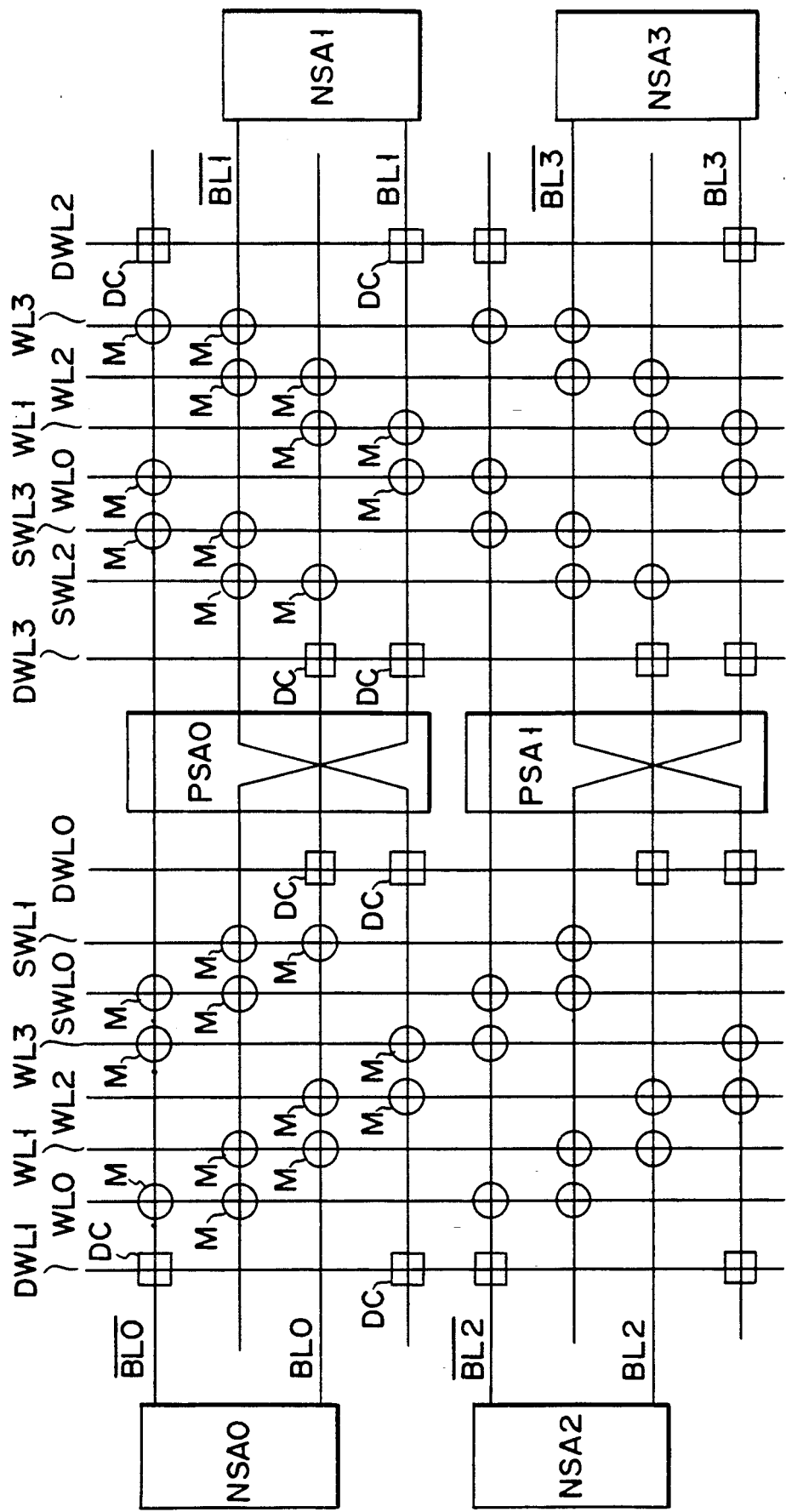
FIG. 13 is a circuit diagram illustrating a DRAM according to a fifth embodiment of the invention.

FIG. 13 shows a DRAM according to a fifth embodiment of the invention. This is a modification of the DRAM shown in FIG. 12, and differs therefrom in that the dummy word lines are driven in forward phase. The dummy word lines DWL0 to DWL3 are set at the "L"-level potential when they are precharged. When a word line is selected, one of these dummy word lines is selected and set to the "H"-level potential. More precisely, when the word line WL0 is selected, the dummy word line DWL0 is selected; when the word line WL1 is selected, the dummy word line DWL1 is selected; when the word line WL2 is selected, the dummy word line DWL2 is selected; and when the word line WL3 is selected, the dummy word line DWL3 is selected.

Figure 14:
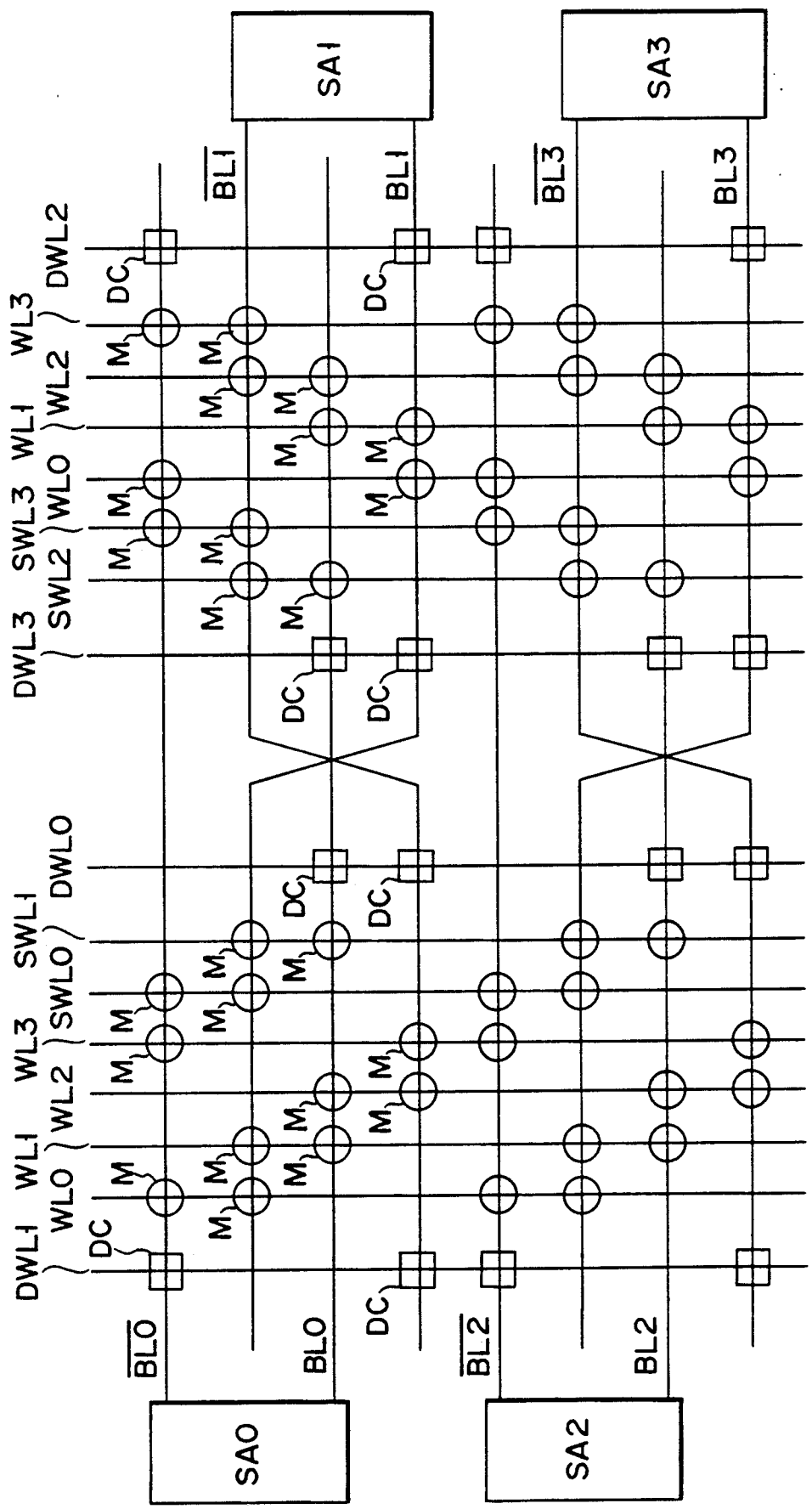
FIG. 14 is a circuit diagram showing a DRAM according to a sixth embodiment of the invention.

FIG. 14 illustrates a DRAM according to a sixth embodiment of the present invention. The sixth embodiment is a modification of the fifth embodiment, and is different in that four sense amplifiers SA0, SA1, SA2, and SA3, each constituted by an NMOS sense amplifier and a PMOS sense amplifier, are used as in the third embodiment (FIG. 11). In this regard, it should be noted that the fourth embodiment shown in FIG. 14 can also be modified in the same way, thus forming a DRAM similar to the sixth embodiment shown in FIG. 14.

The memory-cell array of a DRAM having a great storage capacity is divided into several sub-arrays (e.g., four or eight sub-arrays) which extend parallel to the bit lines, and the sub-arrays adjacent to each other share bit-line sense amplifiers. This type of a DRAM is generally known as "sense-amplifier sharing DRAM." One of the sub-arrays is equivalent to the memory-cell array of any embodiment described above, and the sense amplifiers provided in common for the adjacent sub-arrays is the sense amplifiers connected to the pairs of bit lines in any embodiment described above. In the sense-amplifier sharing DRAM, not only the bit-line sense amplifiers, but also dummy cells and dummy word lines can be used in common for driving adjacent sub-arrays. If this is the case, the sense-amplifier sharing DRAM can have a higher integration density.

Three sense-amplifier sharing DRAMs according to the present invention, wherein not only bit-line sense amplifiers, but also dummy cells and dummy word lines are utilized in common for driving adjacent sub-arrays, will now be described with reference to FIGS. 15, 16, and 17.

Figure 15:
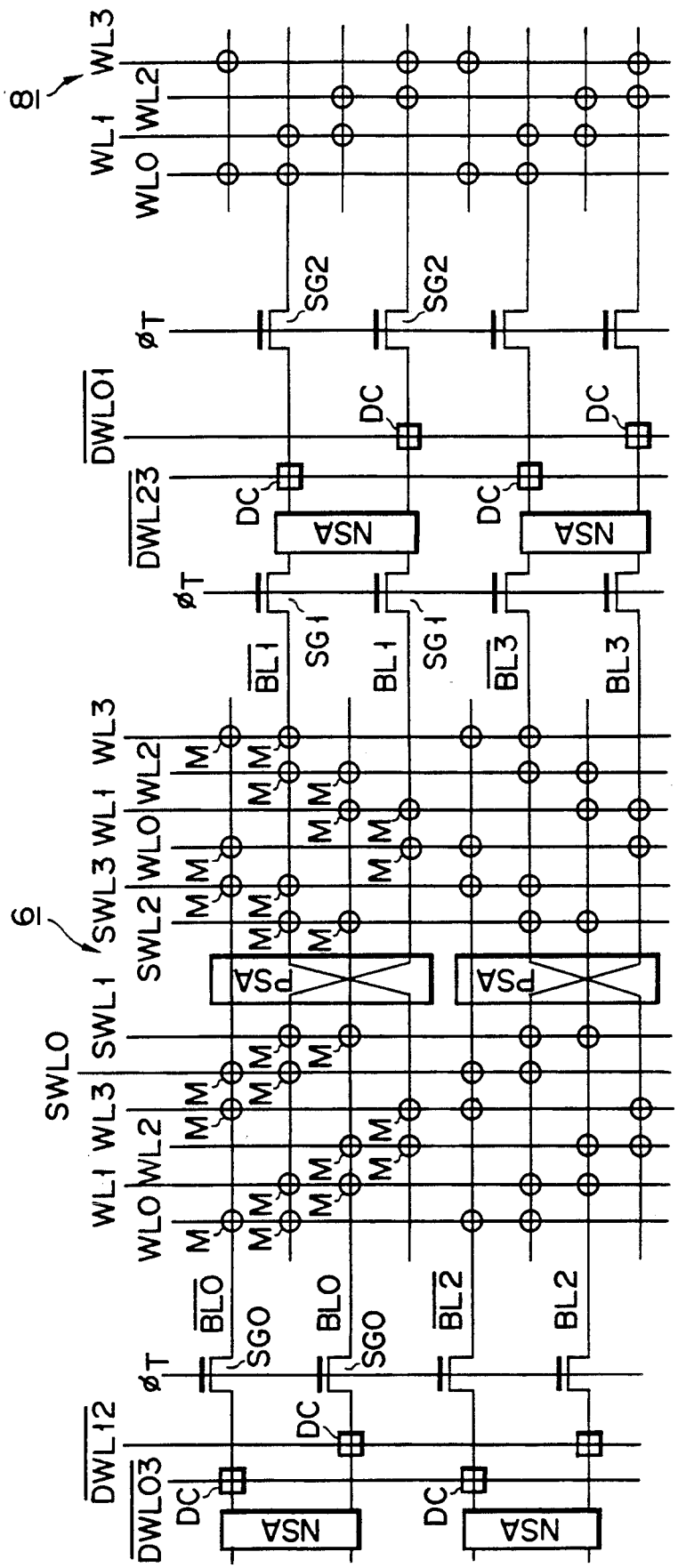
FIG. 15 is a circuit diagram showing a DRAM of sense-amplifier sharing type, which is similar to the first embodiment in basic structure.

FIG. 15 illustrates a sense-amplifier sharing DRAM whose sub-arrays 6, 8 . . . , are similar in basic structure to the memory-cell array of the first embodiment (FIG. 1). As is shown in FIG. 15, either NMOS sense amplifiers NSAs located on the left side of the sub-array 6 is connected by two selecting gates SG0 to the bit lines BL of the corresponding pair incorporated in the sub-array 6. On the other hand, either NMOS sense amplifiers NSAs located on the right side of the sub-array 6 and the left side of the sub-array 8 is connected by two selecting gates SG1 to the bit lines BL of the corresponding pair incorporated in the sub-array 6, and also is connected to by two selecting gates SG2 to the bit lines of the corresponding pair incorporated in the sub-array 8. Thus, both sense amplifiers NSAs located between the sub-arrays 6 and 8 are used in common for driving the adjacent two sub-arrays 6 and 8. They are, in a manner of speech, "shared" by the sub-arrays 6 and 8. Although not shown in FIG. 15, a third sub-array (not shown) is provided on the right side of the sub-array 6. The sense amplifiers NSAs are connected to the corresponding pairs of bit lines of the third sub-array by means of selecting gates SG (not shown), and are thus used in common for driving the sub-array 6 and the third sub-array.

Two dummy word lines DWL03 and DWL12 extend close to the sense amplifiers NSAs located between the sub-array 6 and the third sub-array (not shown), and two dummy word lines DWL01 and DWL23 extend close to the sense amplifiers NSAs located between the sub-arrays 6 and 8. The dummy cells DC connected to the dummy word lines DWL03 and DWL12 are "shared" by the sub-array and the third sub-array (not shown). Also, the dummy cells DC coupled to the dummy word lines DWL01 and DWL23 are "shared" by the sub-arrays 6 and 8. Obviously, the number of dummy cells required, and the that of dummy word lines needed are exactly half the numbers required otherwise. Hence, the sense-amplifier sharing DRAM shown in FIG. 15 has a high integration density.

Figure 16:
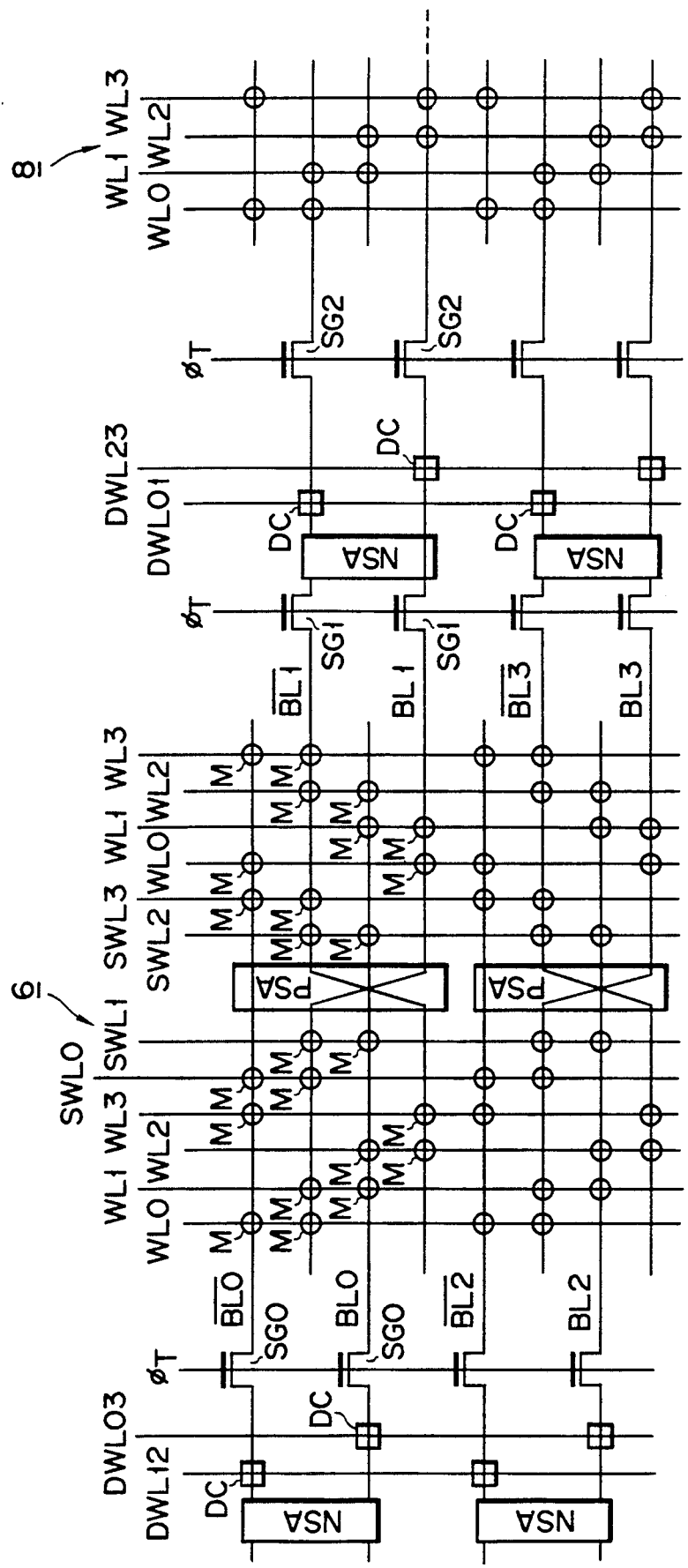
FIG. 16 is a circuit diagram showing a DRAM of sense-amplifier sharing type, which is similar to the second embodiment in basic structure.

FIG. 16 shows a sense-amplifier sharing DRAM whose sub-arrays 6, 8 . . . , are similar in basic structure to the memory-cell array of the second embodiment shown in FIG. 10. As in the DRAM shown in FIG. 16, the dummy cells and the dummy word lines provided between two sub-arrays 6 and 8 are used in common for driving both sub-arrays 6 and 8. The DRAM shown in FIG. 16 has the same advantage as the DRAM illustrated in FIG. 15.

Figure 17:
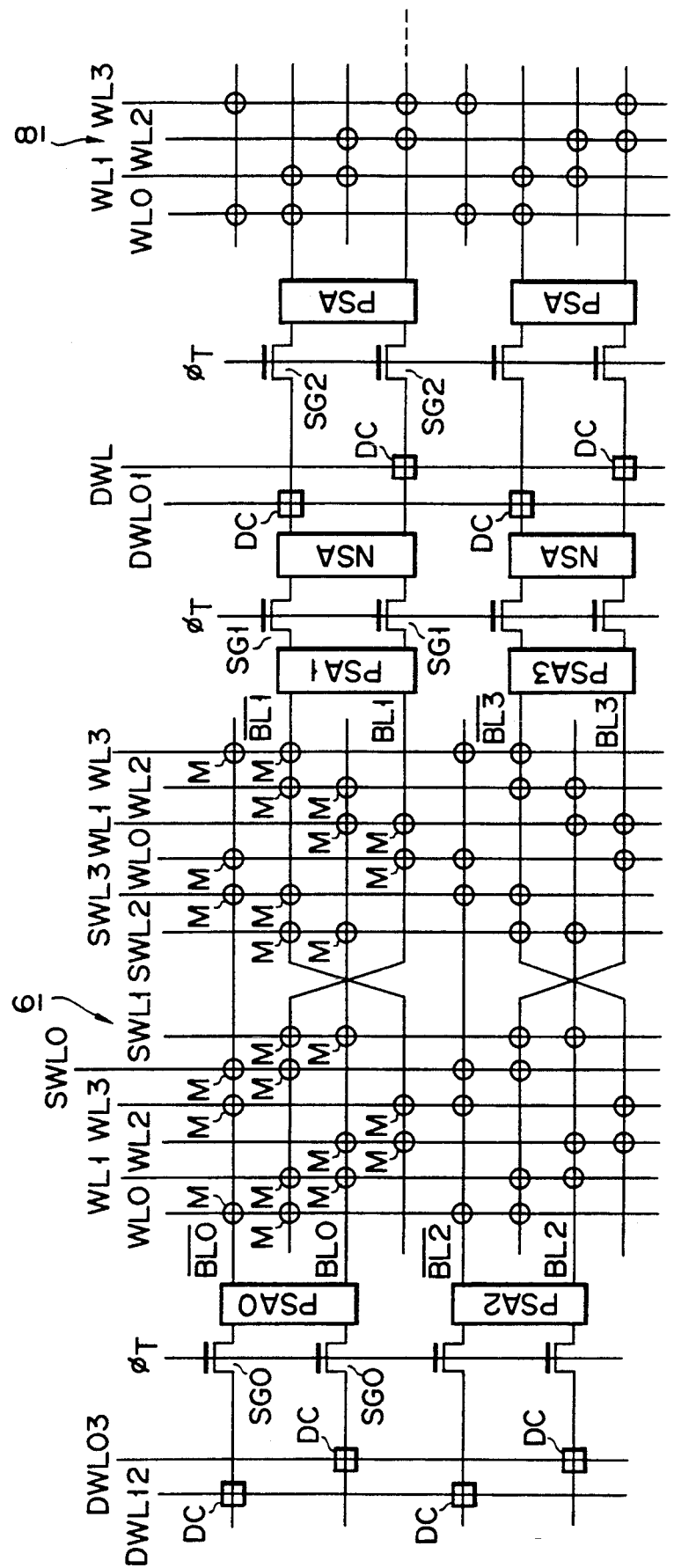
FIG. 17 is a circuit diagram illustrating a DRAM of sense-amplifier sharing type, which is similar to the third embodiment in basic structure.

FIG. 17 shows a sense-amplifier sharing DRAM whose sub-arrays 6, 8 . . . , are similar in basic structure to the memory-cell array of the third embodiment (FIG. 11). In this DRAM, the PMOS sense amplifiers PSAs arranged between the adjacent two sub-arrays, e.g., the sub-arrays 6 and 8, are not "shared" by both sub-arrays, but the NMOS sense amplifiers NSAs, which are arranged also between the adjacent two sub-arrays, are "shared" by both sub-arrays. Further, the dummy cells DC and the dummy word lines, all located between the adjacent two sub-arrays, are used in common for driving both sub-arrays. The DRAM shown in FIG. 17 achieves the same advantage as the DRAM illustrated in FIG. 15.

A DRAM according to a seventh embodiment of the invention will now be described, with reference to FIG. 18. This DRAM is different from those described above, in that the adjacent memory cells connected to the same word line form a group which is arranged every two bit lines, and any adjacent two of these memory cells are shifted by one-pitch distance with respect to the corresponding memory cells connected to either adjacent word line. As can be understood from FIG. 18, the memory cells 10 to 25 are arranged at the intersections of the bit lines BL0, BL0, BL1, BL1, BL2, BL2, BL3, BL3 . . . , and the word lines WL0, WL1, WL3 . . . . Each of the memory cells is comprised of one transistor and one capacitor as is illustrated in FIG. 2. The bit lines BL0 and BL0 make a first pair, the bit lines BL1 and BL1 form a second pair, the bit lines BL2 and BL2 constitute a third pair, the bit lines BL3 and BL3 form a fourth pair, and so forth. Sense amplifiers SA0, SA1, SA2, SA3 . . . , are provided for these pairs of bit lines, respectively.

The bit lines of any two adjacent pairs constitute a bit-line unit. One of the bit lines of the first pair extends between the bit lines of the second pair, and the bit lines of the second pair are twisted at middle portion. This specific arrangement of bit lines help to reduce the interference noise between the bit lines, while maintaining the sufficiently high integration density of the DRAM. This is because the bit lines of any pair are spaced apart, not adjacent to each other, and the coupling capacitance C1 between them does not appear.

For example, the bit line BL0, which form the first pair, along with the bit line BL0, extends between the bit lines BL1 and BL1 forming the second pair, and these bit lines BL1 and BL1 are twisted at middle portion. The bit line BL2, which makes the third pair, together with the bit line BL2, extends close to the right half of the bit line BL1 and the left half of the bit line BL1. Hence, both bit lines BL1 and BL1 receives coupling capacitances of $(\frac{1}{2})C2$, C2, and $(\frac{1}{2})C2$ from the bit lines BL0, BL0 and BL2, respectively, where C2 is the coupling capacitance which any bit line applies to the either adjacent bit line. Obviously, the bit liens of any pair, for example, the bit lines BL1 and BL1, receive the same coupling capacitance from the adjacent bit lines. Therefore, there is no reduction in the potential difference between the bit lines of any pair (e.g., the bit lines BL1 and BL1), and the potential difference is great enough to be detected by the sense amplifier (e.g., the amplifier SA1) connected to the bit-line pair can readily detect it. In other words, the interference noise between the bit lines of any pair is minimized.

As is shown in FIG. 18, the DRAM has four dummy word lines DWL02, DWL13, DWL12, and DLW03—all intersecting with the bit lines. The dummy word lines DWL02 and DLW13 extend on the left side of the twisted portions of the bit lines BL1 and BL1 and those of the bit lines BL3 and BL3, whereas the dummy word lines DWL12 and DWL03 extend on the right side of the twisted portions of the bit lines BL1, BL1, BL3, and BL3. The word lines WL0 and WL1 extend between the dummy word lines DWL02 and DWL13, and the word lines WL2 and WL3 extend between the dummy word lines WL13 and WL03.

One dummy cells are located at the intersection of each dummy word line and one bit line of each bit-line unit. To be specific, a dummy cell 30 is located at the intersection of the dummy word line DWL02 and the bit line BL0; a dummy cell 31 at the intersection of the dummy word line DWL02 and the bit line BL2; a dummy cell 32 at the intersection of the dummy word line DWL13 and the bit line BL0; a dummy cell 33 at the intersection of the dummy word line DWL13 and the bit line BL2; a dummy cell 34 at the intersection of the dummy word line DWL12 and the bit line BL1; a dummy cell 35 at the intersection of the dummy word line DWL12 and the bit line BL3; a dummy cell 36 at the intersection of the dummy word line DWL03 and the bit line BL1; and a dummy cell 37 at the intersection of the dummy word line DWL03 and the bit line BL3.

Hence, two of the four dummy word lines are selected when one of the word line is selected. More precisely, the dummy word lines DWL02 and DWL03 are selected when the word line WL0 is selected. Similarly, the dummy word lines DWL13 and DWL12 are selected when the word line WL1 is selected; the dummy word lines DWL02 and DWL12 are selected when the word line WL2 is selected; the dummy word lines DWL13 and DWL03 are selected when the word line WL3 is selected. Two dummy word lines must be selected to select one word line, but the load of either dummy word line is reduced to half.

The DRAM shown in FIG. 18, i.e., the seventh embodiment of the invention, is advantageous not only in that the interference noise between the bit lines of any pair can be reduced, but also in that its integration density is high because of the reduction in the number of dummy cells required. In addition, a small power supply suffices to drive the dummy cells, the number of which is small.

Figure 19:
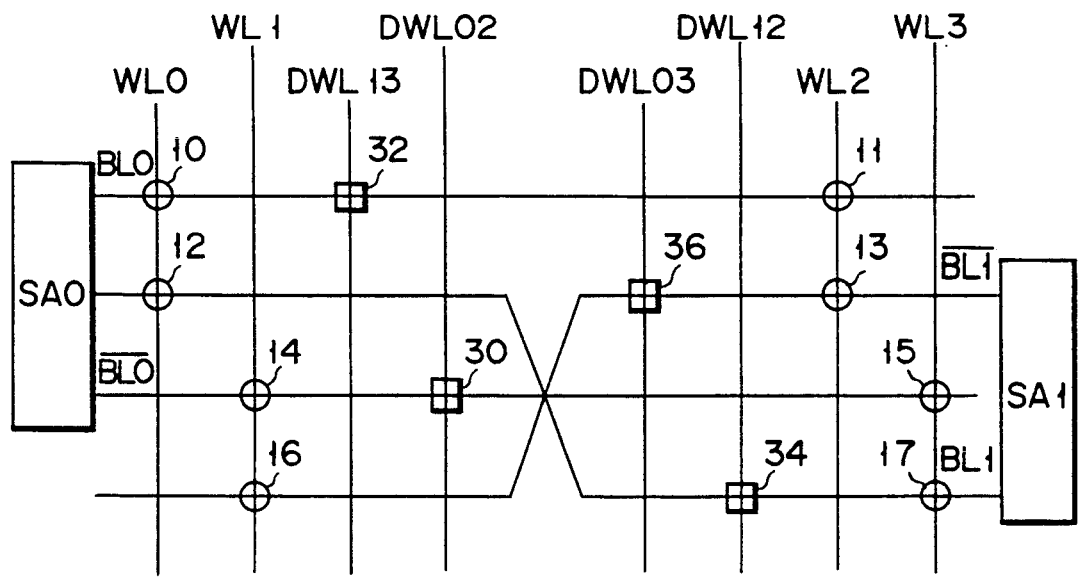
FIG. 19 is a circuit diagram illustrating a DRAM according to an eighth embodiment of the invention.

A DRAM according to an eighth embodiment of the invention will now be described, with reference to FIG. 19. This DRAM is identical to the DRAM shown in FIG. 18, except that the dummy word lines DWL02 and DWL13 extend close to each other and on the right side of the word line WL1, and dummy word lines DWL03 and DWL12 extend close to each other and on the left side of the word line WL2. The elements, either identical or corresponding to those shown in FIG. 18 are designated by the same reference numerals and symbols, and are not described in detail.

Figure 20:
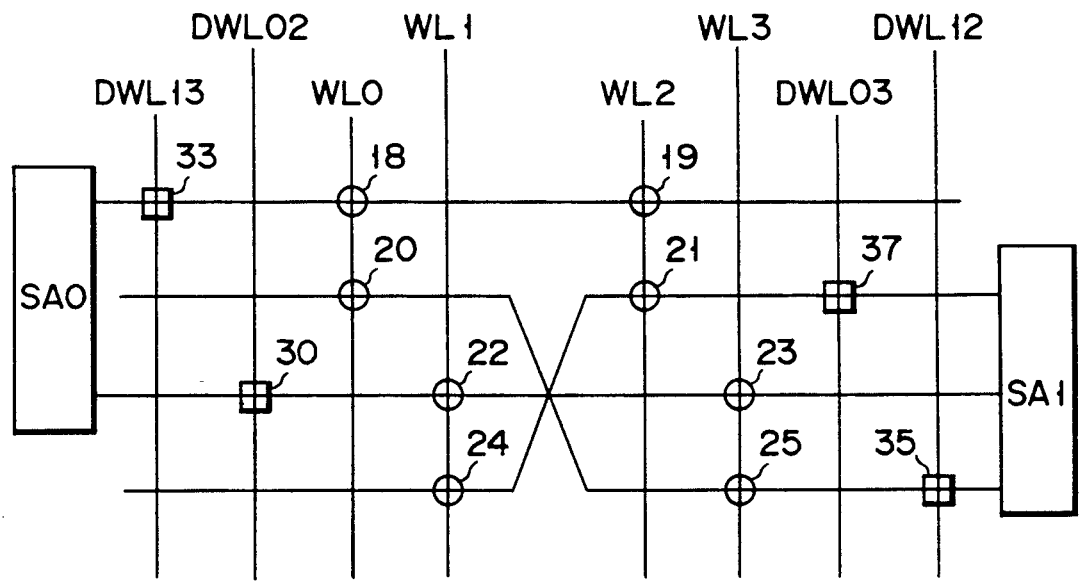
FIG. 20 is a circuit diagram illustrating a DRAM according to a ninth embodiment of this invention.

A DRAM according to a ninth embodiment of the invention will now be described, with reference to FIG. 20. This DRAM is identical to the DRAM shown in FIG. 18, except that the dummy word lines DWL02 and DWL13 extend close to each other and on the left side of the word line WL0, and dummy word lines DWL03 and DWL12 extend close to each other and on the right side of the word line WL3. The elements, either identical or corresponding to those shown in FIG. 18 are designated by the same reference numerals and symbols, and are not described in detail.

As is illustrated in FIG. 21, the bit line BL0 may be spaced part from, not extending between, the bit lines BL1 and BL1 which are twisted at their middle portions. This bit-line arrangement also serves to reduce the interference noise between the bit lines of any pair.

Figure 22:
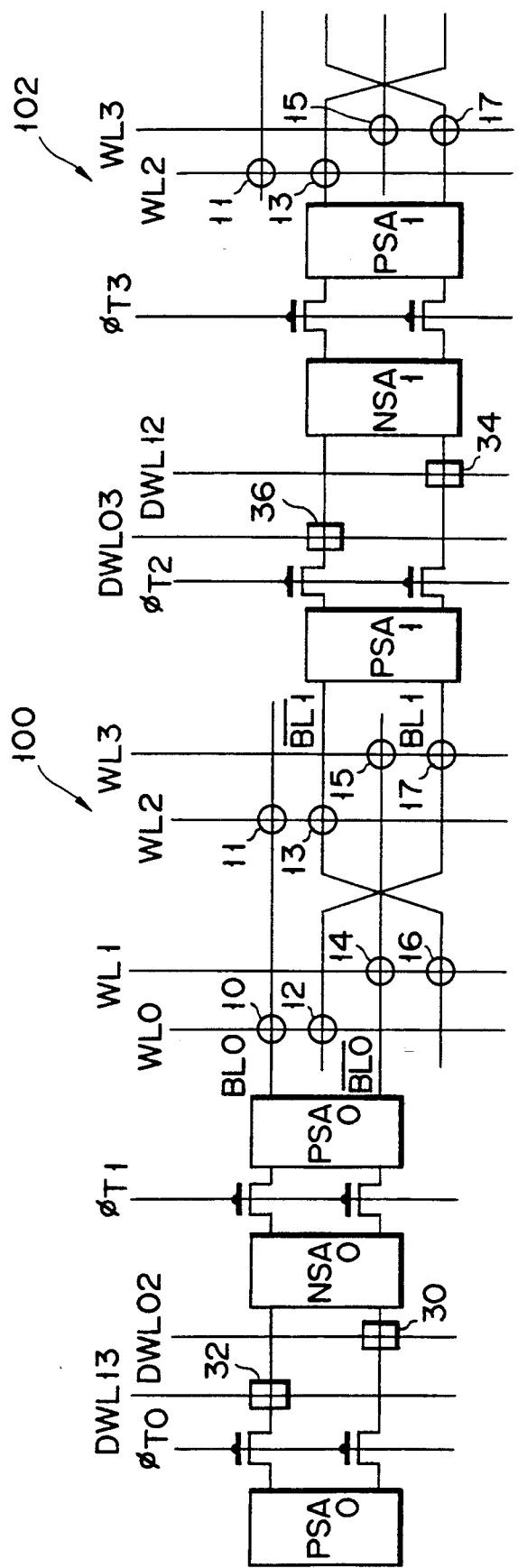
FIG. 22 is a circuit diagram showing a DRAM according to a tenth embodiment of the present invention.

A DRAM according to a tenth embodiment of this invention will now be described, with reference to FIG. 22. This DRAM is a sense-amplifier sharing DRAM whose sub-arrays 100, 102 . . . , are similar in basic structure to the memory-cell array of the seventh embodiment shown in FIG. 18. Dummy word line and dummy cells are provided in common for the adjacent sub-arrays 100 and 102. Thus, the number of dummy word lines and dummy cells, required, is just half the number required in the seventh embodiment. Further, NMOS sense amplifier NSA0 and NMOS sense amplifier NSA1 are "shared" by the sub-arrays. Namely, the circuit between $\phi T0$ and $\phi T1$ is shared by the sub-array 100 and a third sub-array (not shown) when $\phi T0$ or $\phi T1$ is selected, and the circuit between $\phi T2$ and $\phi T3$ is shared by the sub-arrays 100 an 102 when $\phi T2$ or $\phi T3$ is selected. The tenth embodiment achieves the same advantages as the seventh, eighth and ninth embodiments.

A DRAM according to the eleventh embodiment of the invention will now be described, with reference to FIG. 23. This DRAM is identical to the DRAM shown in FIG. 18, except that two dummy cells are located at the intersections of each dummy word line and two bit lines of each bit-line unit. More specifically, dummy cells 30a and 30b are provided at the intersections of the dummy word line DWL0 and the bit lines BL0 and BL1; dummy cells 31a and 31b are provided at the intersections of the dummy word line DWL0 and the bit lines BL2 and BL3; dummy cells 32a and 32b are provided at the intersections of the dummy word line DWL1 and the bit lines BL0 and BL1; dummy cells 33a and 33b are provided at the intersections of the dummy word line DWL1 and the bit lines BL2 and BL3; dummy cells 34a and 34b are provided at the intersections of the dummy word line DWL2 and the bit lines BL0 and BL1; dummy cells 35a and 35b are provided at the intersections of the dummy word line DWL2 and the bit lines BL2 and BL3; dummy cells 36a and 36b are provided at the intersections of the dummy word line DWL3 and the bit lines BL0 and BL1; and dummy cells 37a and 37b are provided at the intersections of the dummy word line DWL3 and the bit lines BL2 and BL3.

Since the dummy cells are arranged in the specific manner described above, they can be accurately selected even though the bit lines of one pair of each bit-line unit are twisted at their middle portions. When the word line WL0, for example, is selected, the dummy word line DWL0 is driven to select the dummy cells 30a, 30b, 31a and 31b. When the word line WL2, which is on the right side of the twisted portions of the bit lines BL1 and BL1 and those of the bit lines BL3 and BL3, is selected, the dummy word line DWL2 is driven to select the dummy cells 34a, 34b, 35a and 35b. In the latter case, the bit lines BL0 and BL1 function as data-reading bit lines, whereas the bit lines BL0 and BL1 function as reference bit lines. Obviously, it suffices to select only one dummy word line in order to read data from the memory cells selected. The data-reading scheme is thus more simple than in the DRAM shown in FIG. 18.

A DRAM according to a twelfth embodiment of the invention will now be described, with reference to FIG. 24. This DRAM is identical to the DRAM shown in FIG. 23, except that the dummy word lines DWL0 and DWL1 extend close to each other and on the right side of the word line WL1, and dummy word lines DWL2 and DWL3 extend close to each other and on the left side of the word line WL2. The elements, either identical or corresponding to those shown in FIG. 23 are designated by the same reference numerals and symbols, and are not described in detail.

A DRAM according to a thirteenth embodiment of the invention will now be described, with reference to FIG. 25. This DRAM is identical to the DRAM shown in FIG. 23, except that the dummy word lines DWL0 and DWL1 extend close to each other and on the left side of the word line WL0, and dummy word lines DWL02 and DWL3 extend close to each other and on the right side of the word line WL3. The elements, either identical or corresponding to those shown in FIG. 23 are designated by the same reference numerals and symbols, and are not described in detail.

A DRAM according to a fourteenth embodiment of the present invention will now be described, with reference to FIG. 26. This embodiment is characterized in that the bit lines BL0 and BL0 of a first pair extend between the bit lines BL1 and BL1 of a second pair, and the bit lines BL1 and BL1 are twisted at their middle portions, and also in that the bit lines BL2 and BL2 of a third pair extend between the bit lines BL3 and BL3 of a fourth pair, and are twisted at their middle portions. Two word lines WL0 and WL1 intersect with those straight portions of the bit lines of the second and third pairs which are on the left side of the twisted portions of the bit lines BL1 and BL1 and those of the bit lines BL2 and BL2. Two word lines WL2 and WL3 intersect with those straight portions of the bit lines which are on the right side of the twisted portions of the bit lines BL1 and BL1 and those of the bit lines BL2 and BL2. Two dummy word lines DWL03 and DWL12 intersect with the left halves of the bit lines—the former on the left of the word line WL0, and the latter on the right of the word line WL1. Similarly, two dummy word lines DWL02 and DWL13 intersect with the right halves of the bit lines—the former on the left of the word line WL2, and the latter on the right of the word line WL3.

One dummy cell is located at one of the four intersections of each dummy word line and the four bit lines forming each bit-line unit. To be specific, a dummy cell 30 is arranged at the intersection of the word line DWL02 and the bit line BL0; a dummy cell 31 is arranged at the intersection of the word line DWL02 and the bit line BL3; a dummy cell 32 is located at the intersection of the word line DWL13 and the bit line BL0; a dummy cell 33 is placed at the intersection of the word line DWL13 and the bit line BL3; a dummy cell 34 is arranged at the intersection of the word line DWL12 and the bit line BL1; a dummy cell 35 is placed at the intersection of the word line DWL12 and the bit line BL2; a dummy cell 36 is located at the intersection of the word line DWL03 and the bit line BL1; and a dummy cell 37 is arranged at the intersection of the word line DWL03 and the bit line BL2.

Figure 26:
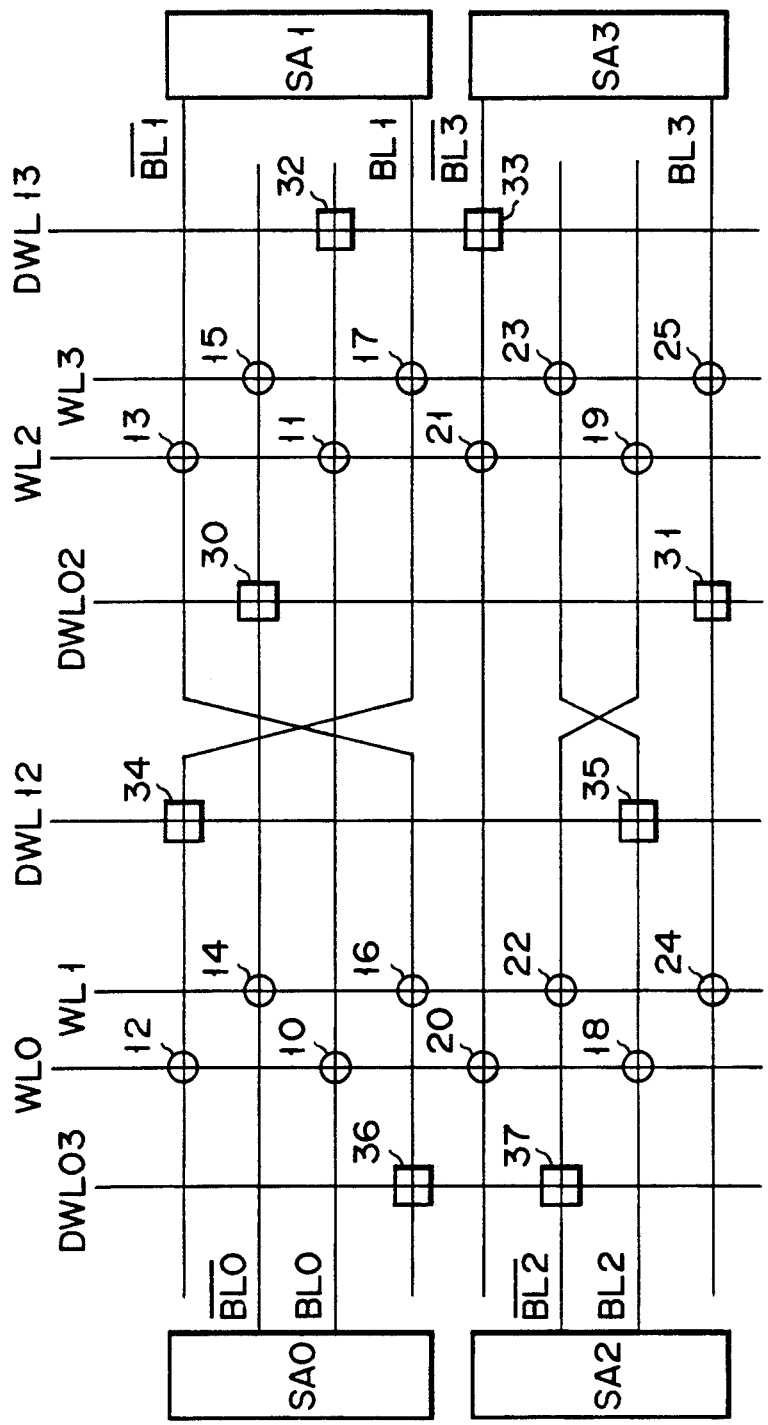
FIG. 26 is a circuit diagram illustrating a DRAM according to a fourteenth embodiment of the present invention.

In the DRAM shown in FIG. 26, when one of the word lines is driven, two of the four dummy word lines are selected. More precisely, when the word line WL0 is driven, the dummy word lines DWL02 and DWL03 are selected; when the word line WL1 is driven, the dummy word lines DWL13 and DWL12 are selected; when the word line WL2 is selected, the dummy word lines DWL01 and DWL12 are selected; and when the word line WL3 is driven, the dummy word lines DWL13 and DWL03 are selected.

The DRAM illustrated in FIG. 26 is advantageous in that the noise resulting from the capacitive coupling of any two adjacent bit lines can be reduced. Also is it advantageous in that the number of dummy memory cells required is small, so that the DRAM has a high integration density and needs but a small power supply for driving the dummy cells.

Figure 27:
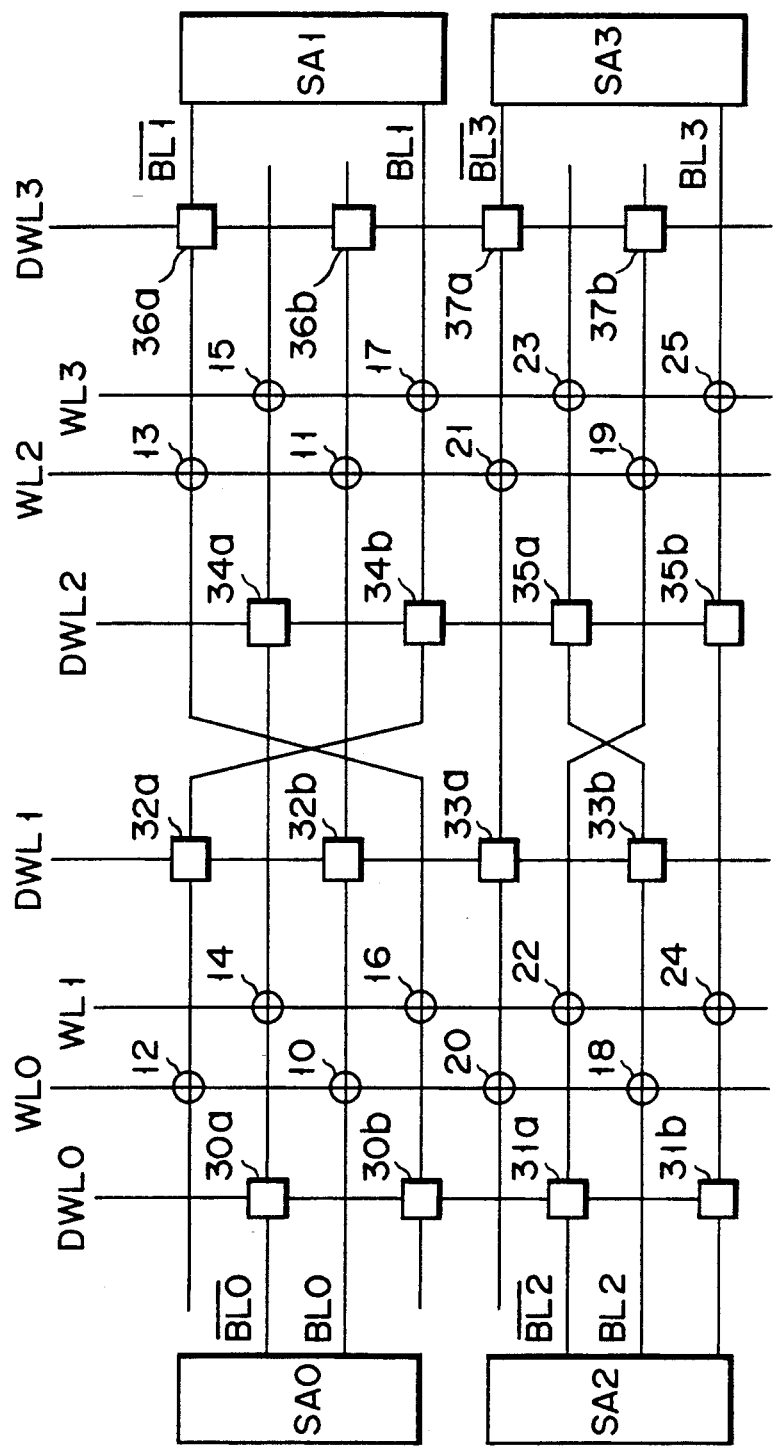
FIG. 27 is a circuit diagram showing a DRAM according to a fifteenth embodiment of the invention.

A DRAM according to a fifteenth embodiment of the invention will be described, with reference to FIG. 27. This embodiment is similar to the fourteenth embodiment, but different in that two dummy cells are located at two of the four intersections of each dummy word line and the four bit lines forming each bit-line unit. More specifically, dummy cells 30a and 30b are arranged at the intersections of a dummy word line DWL0 and bit lines BL0 and BL1 of a first bit-line unit; dummy cells 31a and 31b are placed at the intersections of the dummy word line DWL0 and the bit lines BL2 and BL3 of a second bit-line unit; dummy cells 32a and 32b are placed at the intersections of the dummy word line DWL1 and the bit lines BL1 and BL0 of a first bit-line unit; dummy cells 33a and 33b are placed at the intersections of the dummy word line DWL1 and the bit lines BL3 and BL2 of a second bit-line unit; dummy cells 34a and 34b are placed at the intersections of the dummy word line DWL2 and the bit lines BL0 and BL1 of a first bit-line unit; dummy cells 35a and 35b are placed at the intersections of the dummy word line DWL2 and the bit lines BL2 and BL3 of a second bit-line unit; dummy cells 36a and 36b are located at the intersections of the dummy word line DWL3 and the bit lines BL1 and BL0 of a first bit-line unit; and dummy cells 37a and 37b are arranged at the intersections of the dummy word line DWL3 and the bit lines BL3 and BL2 of a second bit-line unit.

Although the bit lines of one pair of each bit-line unit are twisted at middle portion, the desired dummy cells can be selected accurately. To select the word line WL0 intersecting with the left haves of the bit lines, for example, it suffices to drive the dummy word line DWL0; to select the word line WL2, which intersect with the right halves of the bit lines, it suffices to drive the dummy word line DWL2. In the latter case, the bit lines BL0 and BL1 function as data-reading lines, whereas the bit lines BL0 and BL1 function as reference lines. Only one dummy word line needs to be selected in order to read data from a memory cell. Obviously, with the DRAM shown in FIG. 27 it is easy to select memory cells.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A dynamic-type semiconductor memory device comprising:

a plurality of bit lines, every two bit lines forming a folded bit line pair, every two bit line pairs forming a bit-line unit such that the bit lines of a first pair of the bit-line unit are in parallel to each other, the bit lines of a second pair of the bit-line unit extend parallel with the bit lines of the first pair and cross each other at substantially a midpoint of the second pair, and one of the bit lines of the first pair is provided between the second pair;

a plurality of word lines orthogonally intersecting with the bit lines;

four dummy word lines extending parallel to the word lines and intersecting with the bit lines, two of the dummy word lines being arranged on one side of the crossing portions of the second pair, and the other two of the dummy word lines being arranged on the other side of the crossing portions of the second pair;

a plurality of memory cells connected to selected ones of the intersections of the bit lines and the word lines, such that any adjacent two memory cells connected to the same word line form a group which is arranged every two adjacent bit lines, and any adjacent two memory cells connected to the same bit line are shifted by half-pitch distance with respect to the corresponding two adjacent memory cells connected to either adjacent word line;

a plurality of dummy cells connected to selected ones of the intersections of the bit lines and the dummy word lines, such that at least one dummy cells are connected to each bit line; and a plurality of sense amplifiers provided for the pairs of the bit lines, respectively.

2. The dynamic-type semiconductor memory device according to claim 1, wherein said sense amplifiers include PMOS sense amplifiers located at the middle portions of said bit lines, and NMOS sense amplifiers connected to the ends of said bit lines.

3. The dynamic-type semiconductor memory device according to claim 2, wherein said PMOS sense amplifiers comprise MOS transistors each having a gate electrode, and the bit lines of the second pair of said every two pairs are twisted by using the gate electrodes of the MOS transistors of said PMOS sense amplifiers.

4. The dynamic-type semiconductor memory device according to claim 1, wherein said sense amplifiers are located at the ends of said bit lines.

5. The dynamic-type semiconductor memory device according to claim 1, wherein two dummy cells are connected to each of said bit lines.

6. The dynamic-type semiconductor memory device according to claim 1, wherein said dummy word lines are held at an "H" level while precharged, and any of said dummy word line, which drives the dummy cell connected to the bit line for reading data from a selected one of said memory cells, is set at a "L" level when one of said word lines which is connected to the selected memory cell is activated and set at the "H" level, thereby to drive the dummy cells connected to said bit line.

7. The dynamic-type semiconductor memory device according to claim 1, wherein said dummy word lines are held at a "L" level while precharged, and any of said dummy word lines, which drives the dummy cell connected to the bit line of the bit line pair for reading data from a selected one of said memory cells, is set at an "H" level when one of said word lines which is connected to the selected memory cell is activated and set the "H" level, thereby to drive the dummy cells connected to the bit line.

8. A dynamic-type semiconductor memory device having a memory cell array consisting of a plurality of sub-arrays, any adjacent two of which share sense amplifiers, said memory device comprising:

a plurality of bit lines, every two bit lines forming a folded bit line pair, every two pairs forming a bit-line unit such that the bit lines of a first pair of the bit-line unit are arranged in parallel to each other, the bit lines of a second pair of the bit-line unit extend parallel with the bit lines of the first pair and cross each other at substantially midpoint of the second pair, and one of the bit lines of the first pair is provided between the second pair;

a plurality of word lines orthogonally intersecting with the bit lines;

four dummy word lines extending parallel to the word lines and intersecting with the bit lines, two of the dummy word lines being arranged on one side of the crossing portions of the second pair, and the other two of the dummy word lines being arranged on the other side of the crossing portions of the second pair;

a plurality of memory cells connected to selected ones of the intersections of the bit lines and the word lines, such that any adjacent two memory cells connected to the same word line form a group which is arranged every two adjacent bit lines, and any adjacent two memory cells connected to the same bit line are shifted by half-pitch distance with respect to the corresponding two adjacent memory cells connected to either adjacent bit line;

a plurality of dummy cells connected to selected ones of the intersections of the bit lines and the dummy word lines, such that at least one dummy cell is connected to each bit line; and a plurality of sense amplifiers, each provided for the corresponding two pairs of bit lines of adjacent two sub-arrays.

9. The dynamic-type semiconductor memory device according to claim 8, wherein said sense amplifiers include PMOS sense amplifiers and NMOS sense amplifiers which are located at the ends of said sub-arrays, respectively.

10. The dynamic-type semiconductor memory device according to claim 8, wherein said sense amplifiers include PMOS sense amplifiers provided for said sub-arrays, respectively, and NMOS sense amplifiers each provided for adjacent two sub-arrays and located between the ends of the adjacent two sub-arrays, and connected to the bit lines of both sub-array by means of a selection gate.

11. The dynamic-type semiconductor memory device according to claim 8, wherein two dummy cells are connected to each of said bit lines at the end of each sub-array.

12. The dynamic-type semiconductor memory device according to claim 8, wherein said dummy word lines are held at an "H" level while precharged, and any of said dummy word line, which drives the dummy cell connected to the bit line for reading data from a selected one of said memory cells, is set at a "L" level when one of said word lines which is connected to the selected memory cell is activated and set at the "H" level, thereby to drive the dummy cells connected to said bit line.

13. The dynamic-type semiconductor memory device according to claim 8, wherein said dummy word lines are held at a "L" level while precharged, and any of said dummy word lines, which drives the dummy cell connected to the bit line of the bit line pair for reading data from a selected one of said memory cells, is set at an "H" level when one of said word lines which is connected to the selected memory cell is activated and set the "H" level, thereby to drive the dummy cells connected to the bit line.

14. The dynamic-type semiconductor memory device according to claim 8, wherein said dummy cells are located at the ends of said sub-arrays, connected to the bit lines of said sub-arrays by means of selection gates, and shared by the adjacent sub-arrays.

15. A dynamic-type semiconductor memory device comprising:

a plurality of bit lines, every two bit lines forming a folded bit line pair, every two bit line pairs forming a bit-line unit such that the bit lines of a first pair of the bit-line unit are arranged in parallel to each other, the bit lines of a second pair of the bit-line unit extend parallel with the bit lines of the first pair and cross each other at substantially midpoint of the second pair, and one of the bit lines of the first pair is provided between the second pair;

a plurality of word lines orthogonally intersecting with the bit lines;

four dummy word lines extending parallel to the word lines and intersecting with the bit lines, two of the dummy word lines being arranged on one side of the crossing portions of the second pair, and the other two of the dummy word lines being arranged on the other side of the crossing portions of the second pair;

a plurality of memory cells connected to selected ones of the intersections of the bit lines and the word lines, such that any adjacent two memory cells connected to the same word line form a group which is arranged every two adjacent bit lines, and are shifted by one-pitch distance with respect to the corresponding two adjacent memory cells connected to either adjacent word line;

a plurality of dummy cells connected to selected ones of the intersections of the bit lines and the dummy word lines, such that at least one dummy cell is connected to each bit line; and means for selecting the dummy word lines of the same number as the pairs of bit lines forming the bit-line unit, when one of the word lines are selected.

16. The dynamic-type semiconductor memory device according to claim 15, wherein one bit line of one of the pairs of each bit-line unit extends between the bit lines of the other pair.

17. A semiconductor memory device comprising a plurality of dynamic-type semiconductor memory devices identical to the dynamic-type semiconductor memory device as claimed in claim 15, wherein said dummy word lines and said dummy cells are shared by said dynamic-type semiconductor memory devices.

18. A semiconductor memory device comprising a plurality of dynamic-type semiconductor memory devices identical to the dynamic-type semiconductor memory device as claimed in claim 16, wherein said dummy word lines and said dummy cells are shared by said dynamic-type semiconductor memory devices.

19. A dynamic-type semiconductor memory device which comprises:

a plurality of bit lines, every two bit lines forming a folded bit line pair, every two pairs forming a bit-line unit such that the bit lines of a first pair of the bit-line unit are arranged in parallel to each other, the bit lines of a second pair of the bit-line unit extend parallel with the bit lines of the first pair and cross each other at substantially a midpoint of the second pair, and one of the bit lines of the first pair is provided between the second pair;

a plurality of word lines orthogonally intersecting with the bit lines;

four dummy word lines extending parallel to the word lines and intersecting with the bit lines, two of the dummy word lines being arranged on one side of the crossing portions of the second pair, and the other two of the dummy word lines being arranged on the other side of the crossing portions of the second pair;

a plurality of memory cells connected to selected ones of the intersections of the bit lines and the word lines, such that any adjacent two memory cells connected to the same word line form a group which is arranged every two adjacent bit lines, and are shifted by one-pitch distance with respect to the corresponding two adjacent memory cells connected to either adjacent word line;

a plurality of dummy cells connected to selected ones of the intersections of the bit lines and the dummy word lines, such that at least two dummy cells are connected to each bit line; and means for selecting the dummy word lines of half the number as the pairs of bit lines forming the bit-line unit, when one of the word lines are selected.

20. A dynamic-type semiconductor memory device comprising:
- a plurality of bit lines, every two bit lines forming a folded bit line pair, every two bit line pairs forming a bit-line unit classified in a first bit-line unit and a second bit-line unit which are arranged parallel and adjacent with each other, the bit lines of a first pair of a first bit-line unit being arranged in parallel to each other, the bit lines of a second pair of the first bit-line unit extending parallel with the bit lines of the first pair and crossing each other at substantially a midpoint of the second pair, and the bit lines of the first pair being provided between the second pair, the bit lines of a third pair of a second bit-line unit being arranged in parallel each other, the bit lines of a fourth pair of the second bit-line unit extending parallel with the bit lines of the third pair and crossing each other at substantially a midpoint of the fourth pair, and the bit lines of the fourth pair being provided between the third pair;
- a plurality of word lines orthogonally intersecting with the bit lines;
- four dummy word lines extending parallel to the word lines and intersecting with the bit lines, half of the dummy word lines being arranged on one side of the crossing portions of the second and fourth pairs, and the other half of the dummy word lines being arranged on the other side of the crossing portions of the second and fourth pairs;
- a plurality of memory cells connected to selected ones of the intersections of the bit lines and the word lines, memory cells connected to the same word line being arranged on the interconnections of the bit lines and the word lines at every second interconnections along each word line, and being shifted by one-pitch distance with respect to the corresponding memory cells connected to either adjacent word line;
- a plurality of dummy cells connected to selected ones of the intersections of the bit lines and the dummy word lines, such that at least one dummy cell is connected to each bit line; and
- means for selecting the dummy word lines of the same number as the pairs of bit lines forming the bit-line unit, when one of the word lines are selected.

21. A dynamic-type semiconductor memory device which comprises:
- a plurality of bit lines, every two bit lines forming a folded bit line pair, every two pairs forming a bit-line unit classified in a first bit-line unit and a second bit-line unit which are arranged parallel and adjacent with each other, the bit lines of a first pair of a first bit-line unit being arranged in parallel to each other, the bit lines of a second pair of the first bit-line unit extending parallel with the bit lines of the first pair and crossing each other at substantially a midpoint of the second pair, and the bit lines of the first pair being provided between the second pair, the bit lines of a third pair of a second bit-line unit being arranged in parallel to each other, the bit lines of a fourth pair of the second bit-line unit extending parallel with the bit lines of the third pair and crossing each other at substantially a midpoint of the fourth pair, and the bit lines of the fourth pair being provided between the third pair;
- a plurality of word lines orthogonally intersecting with the bit lines;
- four dummy word lines extending parallel to the word lines and intersecting with the bit lines, half of the dummy word lines being arranged on one side of the crossing portions of the second and fourth pairs, and the other half of the dummy word lines being arranged on the other side of the crossing portions of the second and fourth pairs;
- a plurality of memory cells connected to selected ones of the intersections of the bit lines and the word lines, memory cells connected to the same word line being arranged on the interconnections of the bit lines and the word lines at every second interconnections along each word line, and being shifted by one-pitch distance with respect to the corresponding memory cells connected to either adjacent word line;
- a plurality of dummy cells connected to selected ones of the intersections of the bit lines and the dummy word lines, such that at least two dummy cells are connected to each bit line; and
- means for selecting the dummy word lines of half the number as the pairs of bit lines forming the bit-line unit, when one of the word lines are selected.

* * * * *